(12) United States Patent
Okita

(10) Patent No.: US 8,982,320 B2
(45) Date of Patent: Mar. 17, 2015

(54) ALIGNMENT INFORMATION DISPLAY METHOD AND ITS PROGRAM, ALIGNMENT METHOD, EXPOSURE METHOD, DEVICE PRODUCTION PROCESS, DISPLAY SYSTEM, DISPLAY DEVICE, AND PROGRAM AND MEASUREMENT/INSPECTION SYSTEM

(75) Inventor: Shinichi Okita, Tokyo (JP)

(73) Assignee: Nikon Corporation, Tokyo (JP)

( * ) Notice: Subject to any disclaimer, the term of this patent is extended or adjusted under 35 U.S.C. 154(b) by 1149 days.

(21) Appl. No.: 11/660,385

(22) PCT Filed: Aug. 19, 2005

(86) PCT No.: PCT/JP2005/015169
§ 371 (c)(1),
(2), (4) Date: Jul. 18, 2007

(87) PCT Pub. No.: WO2006/019166
PCT Pub. Date: Feb. 23, 2006

(65) Prior Publication Data
US 2008/0106714 A1    May 8, 2008

(30) Foreign Application Priority Data
Aug. 19, 2004  (JP) .................................. 2004-240058

(51) Int. Cl.
*G03B 27/42* (2006.01)
*G03B 27/32* (2006.01)
(Continued)

(52) U.S. Cl.
CPC .......... *H01L 21/682* (2013.01); *G03F 7/70633* (2013.01); *G03F 9/7003* (2013.01); *G03F 9/7046* (2013.01); *G03F 9/7092* (2013.01)
USPC ................................. 355/53; 355/72; 355/77

(58) Field of Classification Search
CPC . G03F 7/705; G03F 7/70491; G03F 7/70483; G03F 7/70666; G03F 7/70633; G03F 7/70616; G03F 7/70775; G03F 7/70725; G03F 7/70691; G03F 7/70675; G03F 7/7019; G03F 9/7092; G03F 9/7082; G09G 2310/04
USPC .............. 355/53, 77, 52, 55, 72–75; 715/764, 715/771; 356/399–401; 250/492.1, 492.2, 250/492.22, 548
See application file for complete search history.

(56) References Cited

U.S. PATENT DOCUMENTS
3,812,288 A * 5/1974 Walsh et al. ................. 378/98.6
4,873,623 A * 10/1989 Lane et al. ...................... 700/83
(Continued)

FOREIGN PATENT DOCUMENTS
EP       1 603 153 A1   12/2005
JP       A 61-44429     3/1986
(Continued)

OTHER PUBLICATIONS
Supplementary European Search Report dated Dec. 28, 2009.
(Continued)

*Primary Examiner* — Christina Riddle
(74) *Attorney, Agent, or Firm* — Oliff PLC

(57) ABSTRACT

An information display method that enables for efficient analysis and evaluation of alignment results and thereby facilitating the setting of effective alignment conditions or parameters. The alignment information display method receives as input the data of the results of processing relating to alignment measurement, receives as input information relating to the parameters of the alignment measurement, finds the information for display from the data of the results of processing based on the input parameters, and displays the found desired information for display by a display mode by which the effects on the alignment measurement become clear. Therefore, in setting the desired conditions, it is possible to easily confirm the results of analysis by the set conditions, that is, the effects of the set conditions. Therefore, a user can easily detect the optimum alignment conditions and parameters.

30 Claims, 23 Drawing Sheets

(51) Int. Cl.
*H01L 21/68* (2006.01)
*G03F 7/20* (2006.01)
*G03F 9/00* (2006.01)
*G03B 27/58* (2006.01)

(56) References Cited

U.S. PATENT DOCUMENTS

| | | | |
|---|---|---|---|
| 4,958,082 A * | 9/1990 | Makinouchi et al. | 250/548 |
| 5,197,118 A * | 3/1993 | Sato et al. | 358/1.5 |
| 5,226,118 A * | 7/1993 | Baker et al. | 715/833 |
| 5,461,708 A * | 10/1995 | Kahn | 345/440 |
| 5,525,808 A | 6/1996 | Irie et al. | |
| 5,757,673 A | 5/1998 | Osheiski et al. | |
| 5,761,064 A * | 6/1998 | La et al. | 700/110 |
| 5,798,195 A * | 8/1998 | Nishi | 430/22 |
| 6,097,204 A * | 8/2000 | Tanaka et al. | 324/765 |
| 6,128,403 A * | 10/2000 | Ozaki | 382/145 |
| 6,542,830 B1 * | 4/2003 | Mizuno et al. | 702/35 |
| 6,815,233 B1 * | 11/2004 | Erhardt et al. | 438/14 |
| 6,909,930 B2 * | 6/2005 | Shishido et al. | 700/121 |
| 2003/0007677 A1 * | 1/2003 | Hiroi et al. | 382/149 |
| 2003/0071980 A1 * | 4/2003 | Ina et al. | 355/53 |
| 2004/0119749 A1 * | 6/2004 | Luque | 345/771 |
| 2004/0156029 A1 | 8/2004 | Hansen | |
| 2005/0036144 A1 * | 2/2005 | Suzuki | 356/401 |
| 2006/0040191 A1 | 2/2006 | Okita | |
| 2006/0285740 A1 * | 12/2006 | Okita | 382/151 |
| 2007/0201018 A1 * | 8/2007 | Takeda et al. | 356/237.2 |

FOREIGN PATENT DOCUMENTS

| | | |
|---|---|---|
| JP | A 62-84516 | 4/1987 |
| JP | A 2-54103 | 2/1990 |
| JP | A 4-324615 | 11/1992 |
| JP | A 5-190423 | 7/1993 |
| JP | A 6-232028 | 8/1994 |
| JP | A 6-283403 | 10/1994 |
| JP | A 6-349701 | 12/1994 |
| JP | A 10-112433 | 4/1998 |
| JP | A 2000-173882 | 6/2000 |
| JP | A 2000-173921 | 6/2000 |
| JP | A 2002-237451 | 8/2002 |
| JP | A 2003-142378 | 5/2003 |
| JP | A 2004-247737 | 9/2004 |
| JP | A-2004-265957 | 9/2004 |

OTHER PUBLICATIONS

Taiwanese Office Action dated Dec. 19, 2011 in Taiwanese Patent Application No. 094128287 (with translation).
Korean Office Action dated Aug. 30, 2011 in Korean Patent Application No. 2007-7003907 (with translation).

* cited by examiner

FIG. 19

| Wafer | Shot Pos. | Sim. Param.No. | 1 | | 2 | |
|---|---|---|---|---|---|---|
| | | | X | Y | X | Y |
| 1 | (7.4) | | 0.0049 | ——— | ——— | 0.0035 |
| 1 | (8.4) | | 0.0008 | ——— | ——— | 0.0058 |
| 1 | (8.5) | | 0.0063 | ——— | ——— | -0.0010 |
| 1 | (9.5) | | 0.0190 | ——— | ——— | -0.0037 |
| 1 | (8.6) | | -0.0053 | ——— | ——— | -0.0117 |
| 1 | (7.6) | | -0.0050 | ——— | ——— | -0.0072 |
| 1 | (7.7) | | 0.0001 | ——— | ——— | -0.0091 |
| 1 | (8.7) | | -0.0030 | ——— | ——— | -0.0137 |
| 1 | (9.7) | | 0.0068 | ——— | ——— | -0.0133 |
| 1 | (6.7) | | 0.0076 | ——— | ——— | 0.0020 |
| 1 | (6.8) | | 0.0031 | ——— | ——— | 0.0049 |
| 1 | (5.8) | | 0.0067 | ——— | ——— | 0.0243 |
| 1 | (5.7) | | 0.0087 | ——— | ——— | 0.0084 |
| 1 | (4.7) | | 0.0078 | ——— | ——— | 0.0067 |
| 1 | (3.7) | | 0.0052 | ——— | ——— | 0.0155 |
| 1 | (2.7) | | 0.0108 | ——— | ——— | 0.0044 |
| 1 | (2.6) | | -0.0048 | ——— | ——— | -0.0006 |
| 1 | (1.6) | | -0.0070 | ——— | ——— | -0.0063 |
| 1 | (2.5) | | -0.0238 | ——— | ——— | -0.0043 |
| 1 | (1.4) | | 0.0028 | ——— | ——— | -0.0112 |
| 1 | (2.4) | | -0.0005 | ——— | ——— | -0.0016 |

| Total | Wafer | Sim. Param.No. | 1 | | 2 | |
|---|---|---|---|---|---|---|
| | | | X | Y | X | Y |
| Average | 1 | | -0.000 | ——— | ——— | -0.000 |
| 3sigma | 1 | | 0.0314 | ——— | ——— | 0.0256 |

600

610

ALIGNMENT INFORMATION DISPLAY METHOD AND ITS PROGRAM, ALIGNMENT METHOD, EXPOSURE METHOD, DEVICE PRODUCTION PROCESS, DISPLAY SYSTEM, DISPLAY DEVICE, AND PROGRAM AND MEASUREMENT/INSPECTION SYSTEM

TECHNICAL FIELD

The present invention relates to alignment processing performed in a lithography process when producing, for example, a semiconductor device, liquid crystal display device, CCD, or other imaging device, plasma display device, thin film magnetic head, or other electronic device (hereinafter simply referred to as an "electronic device"), more particularly relates to an alignment information display method, alignment information display program, display device, and program relating to that display for displaying information relating to the alignment processing in a desired mode so as to enable suitable, easy setting of conditions, parameters, etc. for measurement of alignment and a measurement/inspection system for outputting data provided for such a display. Further, it relates to an adjustment method for determining the position of the wafer etc. by the conditions and parameters set based on the displayed information, an exposure method for exposure by alignment by this alignment method, a device production process using this exposure method, and a display system for displaying information related to the desired processing by the desired mode.

BACKGROUND ART

In recent years, in the process of production of semiconductor devices or other electronic devices, step-and-repeat type, step-and-scan type, or other exposure apparatuses, wafer probers, laser levelers, etc. are being used. These devices have to position (align) each of the plurality of chip pattern areas (shot areas) with respect to predetermined reference positions at a high precision. These reference positions are for example processing points or other positions defined for processing at the different devices and are defined on a stationary coordinate system defining the movement and positions of a substrate being processed specifically, for example, they are defined on an orthogonal coordinate system defined by laser interferometers.

In an exposure apparatus, it is necessary to align a semiconductor wafer or glass plate or other substrate stably with a high precision with respect to projected positions of patterns formed on a mask or reticle (hereinafter simply referred to as a "reticle"). In particular, in an exposure process of semiconductor devices, 10 or more layers of circuit patterns (reticle patterns) are transferred overlaid on a wafer. Therefore, if the overlay accuracy between layers is poor, the characteristics of the circuits formed deteriorate. In the worst case, the semiconductor devices become defective and the overall yield ends up falling.

Therefore, in the exposure process, marks provided in advance at the shot areas on the wafer are used for alignment, that is, wafer alignment is performed. That is, an alignment mark is provided at each of the plurality of shot areas on the wafer. At the time of exposure processing, first, the position (coordinate value) of the alignment mark of the shot area being exposed in the stage coordinate system (stationary coordinate system) is detected. Further, the shot area is positioned with respect to the reticle patterns based on the position information of this alignment mark and the position information of the reticle pattern measured in advance.

There are two main systems for wafer alignment. One is the die-by-die (D/D) alignment system for positioning by detecting the alignment mark for each shot area on the wafer. The other is the global alignment system for positioning each shot area by detecting the alignment marks of several shot areas on the wafer and finding the regularity of the array of shot areas. As of the present time, in production lines of electronic devices, mainly the global alignment system is being used due to the balance with the throughput. In particular, recently, the enhanced global alignment (EGA) system detecting the regularity of the array of shot areas on a wafer by a high precision by a statistical technique is being broadly used (for example, see Patent Document 1 and Patent Document 2).

Patent Document 1: Japanese Patent Publication (A) No. 61-44429

Patent Document 2: Japanese Patent Publication (A) No. 62-84516

The EGA system measures the position coordinates of a plurality of shot areas on a single wafer selected in advance as specific shot areas (sometimes referred to as "sample shot areas" or "alignment shot areas"). Three or more of these specific shot areas are required. Usually, seven to 15 or so are used. The position coordinates of all of the shot areas on the wafer (array of shot areas) are calculated from the measurement values of the position coordinates at these specific shot areas using the least square method or other statistical processing. Further, the wafer stage is stepped in accordance with this calculated array of shot areas. Therefore, the EGA system has the advantages that the measurement time can be kept short and the effect of averaging the random measurement error can be expected.

The method of statistical processing used in wafer alignment of the EGA system (hereinafter simply referred to as an "EGA") will be simply explained.

A model where the design array coordinates of m (m: an integer of 3 or more) number of specific shot areas on the wafer are designated as (Xn, Yn) (n=1, 2, . . . , m) and the deviations ($\Delta Xn$, $\Delta Yn$) from the design array coordinates are shown by for example equation (1) will be assumed.

[Equation 1]
$$\begin{pmatrix} \Delta Xn \\ \Delta Yn \end{pmatrix} = \begin{pmatrix} a & b \\ c & d \end{pmatrix} \begin{pmatrix} Xn \\ Yn \end{pmatrix} + \begin{pmatrix} e \\ f \end{pmatrix} \quad (1)$$

If designating the deviations (measured value) from the design array coordinates of the actual array coordinates of the m number of sample shot areas as ($\Delta xn$, $\Delta yn$), the sum of the squares E of the difference between the deviations and the deviations ($\Delta Xn$, $\Delta Yn$) from the array coordinates in the linear model shown by equation (1) is shown by equation (2).

[Equation 2]
$$E = \Sigma((\Delta xn - \Delta Xn)^2 + (\Delta yn - \Delta Yn)^2) \quad (2)$$

Therefore, the parameters a, b, c, d, e, and f minimizing the value E of equation (2) are calculated. Further, the array coordinates of all of the shot areas on the wafer are calculated based on the calculated parameters a to f and the design array coordinates (Xn, Yn).

In this way, the EGA system gives a linear first order approximation of the deviation between the design position and the actual position defined on the wafer and can correct the linear component of the expansion/contraction, rotation, or other deviation of the wafer.

However, to suitably perform such alignment and accurately position the shot areas, it is necessary to suitably set the conditions and parameters relating to alignment, specifically, the EGA calculation model (calculation model, actually effective terms, coefficients, etc.), reject allowance, shots for EGA calculation, wafer for measurement, and other conditions and parameters. Further, when desiring to set more suitable conditions and parameters and performing positioning at a high precision, it is important to analyze or measure the results of actual alignment. Specifically, for example, it is important to conduct actual measurements of the results of EGA or the results of overlay exposure to collect the data of the results of processing and evaluate and analyze this data.

However, in the past, for the display of information on the measurement results relating to alignment, only a low level display of an extent displaying the alignment measurement value, alignment correction value, residual component after alignment correction, alignment mark waveform, or other data by numerical data for each wafer or each shot or at the most displaying these by vector data was given.

For this reason, there was the problem that it was difficult for a worker to determine the effective conditions and parameters relating to alignment based on the measurement results. That is, it was difficult to analyze and evaluate the data and difficult to optimize the alignment conditions and parameters based on the data of the measurement results output for display.

DISCLOSURE OF THE INVENTION

An object of the present invention is to provide an alignment information display method, alignment information display program, display device, and display program enabling efficient analysis or evaluation of data of measurement results for the results of actual alignment and as a result enabling effective alignment conditions or parameters to be set.

Further, another object of the present invention is to provide an alignment method enabling high precision positioning using effective alignment conditions and parameters set based on the measurement results for the actual alignment results.

Further, another object of the present invention is to provide a measurement/inspection system for outputting data for use for such display.

Further, another object of the present invention is to provide an exposure method able to perform exposure maintaining a good overlay accuracy by alignment by such a method.

Further, another object of the present invention is to provide a device production process able to produce a high quality electronic device by application of an exposure process with a good overlay accuracy.

Further, another object of the present invention is to provide a display system enabling efficient analysis or evaluation of data of the measurement results for example for the results of alignment or other predetermined processing and thereby set effective conditions etc.

According to the alignment information display method according to the present invention, there is provided a method of display of information relating to alignment measurement for positioning an object, having a step of inputting data of results of predetermined processing relating to the alignment measurement (step S101), a step of inputting information relating to a parameter of the alignment measurement (step S102), a step of finding desired information for display from data of the input results of processing based on the input parameter (steps S103, S104), and a step of displaying the found desired information for display by a predetermined display mode by which effects of the parameter of the alignment measurement on the alignment measurement are clear (steps S108, S109, S112). (see FIG. 4)

According to this alignment display method, first, for example, based on information relating to a EGA calculation model, reject allowance, shots for EGA calculation, wafer for measurement, or other alignment measurement parameter, the method processes for example data of EGA measurement results, data of overlay exposure measurement results, or other data of processing results to find the desired information for display. Further, it displays the found information by a display mode whereby the effects of the input calculation parameters etc. on the information become clear. Therefore, it is possible to set the desired conditions and easily confirm the results of analysis by the set conditions, in other words, the effects of the set conditions. As a result, a user can easily detect the optimum alignment conditions or parameters.

Preferably, the alignment information display method according to the present invention further has a step of receiving input of an evaluation target (step S105), a step of receiving input of a display unit (step S106), and a step of designating a desired display mode (steps S107, S108, S109, S111), wherein the display step (steps S108, S109, S112) displays the found desired information for display in units of the input display unit by the designated display mode so as to enable evaluation of the input evaluation target. (See FIG. 4)

According to this configuration, for example, it is possible to detect desired information for evaluation such as alignment measurement values, alignment correction values, residual components after alignment correction, and alignment mark waveforms and display these in units of desired evaluation units such as each predetermined plurality of lots, each single lot, each predetermined plurality of wafers, each single wafer, each plurality of shots processed, each single shot, each predetermined plurality of marks, or each single mark. Further, for example, it is possible to display the results by a desired display mode such as a numerical data display, vector data display, histogram-scatter diagram, trend graph, or other statistical display, sort result display, or waveform data display, that is, a desired mode enabling easy evaluation of an evaluation target. Therefore, the user can more efficiently perform analysis or evaluation and efficiently detect optimum alignment conditions or parameters.

Further, preferably the alignment information display method according to the present invention further has a step of inputting information relating to simulation of the alignment measurement (step S103) and a step of running a predetermined simulation in accordance with need based on the input information-relating to simulation (step S104), wherein the step for display (S108, S109) displays at least one of the simulation results and the found desired information for display in units of the input display unit by the designated display mode to thereby enable evaluation of the input evaluation target.

Preferably, the method further comprises finding and displaying a plurality of the simulation results or the found desired information for display and having the step of display (step S109) display the plurality of simulation results or the found desired information for display in units of the input display unit by the designated display mode to thereby enable evaluation of the input evaluation target. (See FIG. 4)

According to this configuration, it is possible to perform for example EGA simulation, overlay simulation, etc. in addition to the data of the processing results and efficiently analyze or evaluate these simulation results.

Further, when using data of a plurality of such simulation results or processing results, it is possible to display for comparison a plurality of data among that data. Therefore, it is possible to display desired information under various conditions, in other words, possible to perform analysis and comparative studies from various perspectives and set more suitable alignment conditions and parameters.

Further, preferably, the alignment information display method according to the present invention further has a step of inputting information relating to display of log information of the alignment measurement (step S111), and the step of display (step S112) displays log information of the alignment measurement in accordance with need based on information relating to display of the input log information. (See FIG. 4)

According to this configuration, it is possible to display not only processing results and simulation data, but also for example alignment parameters, measurement status, measurement error information, etc. Therefore, it is possible to efficiently analyze results when waveform detection error occurs, when an anomaly occurs in measurement results, etc. Note that this "anomaly" indicates data with a relatively large difference compared with other data.

Further, the alignment information display program according to the present invention is a program for making a computer display information relating to alignment measurement for positioning an object, having a step of inputting data of predetermined processing results relating to the alignment measurement, a step of inputting information relating to a parameter of the alignment measurement, a step of finding desired information for display from data of the input processing results based on the input parameter, and a step of displaying the found desired information for display by a predetermined display mode by which the effects of the parameter of the alignment measurement on the alignment measurement become clear.

Further, the alignment method according to the present invention determines a parameter of the alignment measurement based on information relating to alignment measurement displayed by an alignment information display method as set forth in any of the above and uses the determined parameter for alignment measurement to position an object.

Further, the exposure method according to the present invention is an exposure method for transferring predetermined patterns to a plurality of areas formed on a substrate, characterized by using the above-mentioned alignment method to position the plurality of areas on the substrate and the predetermined patterns and transferring the predetermined patterns to positioned areas.

Further, the device production process according to the present invention is characterized by including a step of using the above-mentioned exposure method to transfer device patterns on the device substrate.

Further, the display system according to the present invention is a display system for displaying results of functional evaluation of a predetermined function of a predetermined device, the system having a storage device connected with the predetermined device in a manner enabling transmission of information and storing information relating to results of processing performed by the predetermined device in the past, a first input device for inputting usage conditions when using the predetermined function, a simulation device connected to the storage device and the first input device in a manner enabling transmission of information and simulating processing results when performing the predetermined function under the usage conditions input from the first input device based on processing results at the predetermined device stored in the storage device, a display device for displaying results of simulation by the simulation device, and a second input device for selecting and instructing a display mode for when displaying the simulation results by the display device from among a plurality of previously prepared display modes.

Further, the display device according to the present invention is a display device for displaying information relating to processing results of alignment having a setting screen for selecting and setting any display mode from a plurality of display modes, a processing device connected to the setting screen and performing processing relating to alignment, and a result display screen connected to the processing device and displaying information relating to results of performance of the processing by the display mode set by the selection screen.

Further, the program according to the present invention is a program for making a computer system perform a step of displaying a setting screen for selecting and setting any display mode from a plurality of display modes, a step of performing processing relating to alignment, and a step of displaying information relating to the alignment processing results by the display mode set by the setting screen.

Further, the measurement/inspection system according to the present invention is a measurement/inspection system for detecting information relating to an overlay state of different layers formed overlaid on the substrate, the system outputting the detected information as data used for processing in a computer system by a program making the computer system perform a step of displaying a setting screen for selecting and setting any display mode among a plurality of display modes, a step of performing processing relating to alignment, and a step of displaying information relating to the alignment processing results by a display mode set by the setting screen.

Note that in this section, the components were described with reference notations of corresponding components shown in the attached drawings, but these were only for facilitating understanding and do not show in any way that the means according to the present invention are limited to the embodiments explained later with reference to the attached drawings.

According to the present invention, it is possible to provide an alignment information display method, alignment information display program, display device, and display program enabling efficient analysis or evaluation of data of measurement results on actual results of alignment and thereby enabling more effective alignment conditions or parameters to be set.

Further, it is possible to provide an alignment information display program for the case of displaying such alignment information by a computer.

Further, it is possible to provide a measurement/inspection system for outputting data used for such a display.

Further, it is possible to provide an enabling high precision positioning using effective alignment conditions or parameters set based on measurement results on the actual alignment results.

Further, it is possible to provide an exposure method enabling exposure maintaining good overlay accuracy by alignment by this method.

Further, it is possible to provide a device production process enabling production of high quality electronic devices by applying an exposure process with good overlay accuracy.

Further, for example it is possible to provide a display system enabling efficient analysis or evaluation of data of measurement results on results of alignment or other predetermined processing and enabling the more effective conditions etc. to be set.

BRIEF DESCRIPTION OF THE DRAWINGS

FIG. 19 is a view showing an example of display output of information according to the present invention and shows a shot data list display screen.

BEST MODE FOR CARRYING OUT THE INVENTION

An embodiment of the present invention will be explained with reference to FIG. 1 to FIG. 23.

In the present embodiment, an exposure system having exposure apparatuses and an alignment data evaluation system will be illustrated to explain the present invention.

Exposure System

First, the overall configuration of the exposure system of the present embodiment will be explained with reference to FIG. 1 to FIG. 3.

Figure 1:
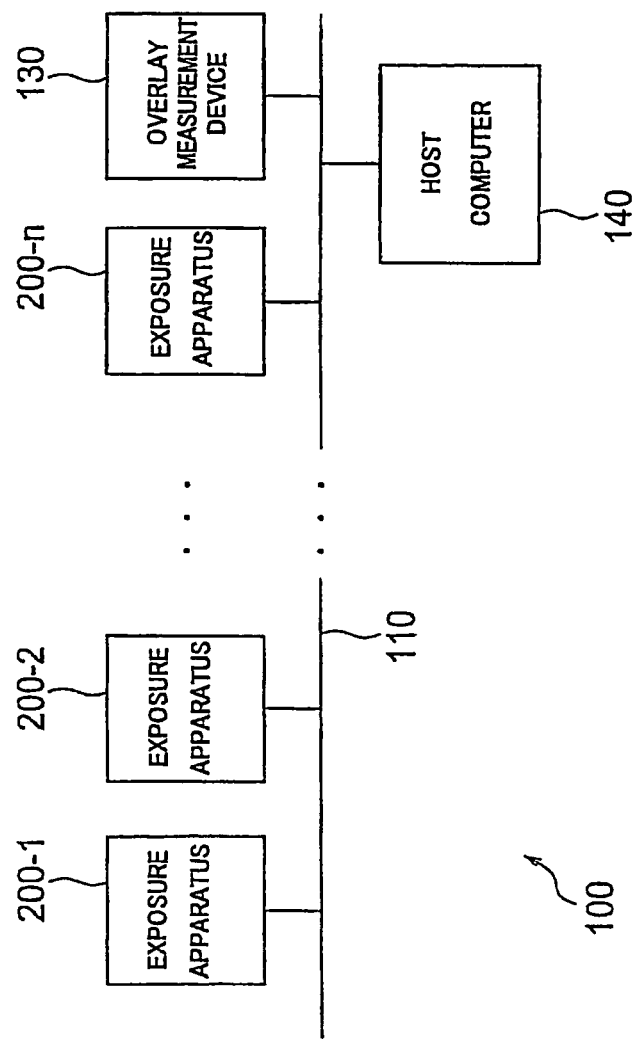
FIG. 1 is a view showing the configuration of an exposure system of an embodiment of the present invention.

FIG. 1 is a view showing the overall configuration of the exposure system 100 according to the present embodiment.

As shown in FIG. 1, the exposure system 100 has N number of exposure apparatuses 200-1 to 200-n, an overlay measuring device 130, and a host computer 140. These devices are connected by a LAN 110 to enable transfer of data between each other. Note that the LAN 110 may further have other processing devices, measuring devices, computers, etc. connected to it to enables transfer of data.

Each exposure apparatus 200-i (i=1 to n) (hereinafter simply referred to as an "exposure apparatus 200") performs exposure processing on wafers input for each lot so as to successively form patterns on them. That is, each shot area defined on a wafer is positioned with a predetermined exposure position of the exposure apparatus 200 and exposed by the exposure light passing through the reticle so as to successively transfer images of the patterns formed on the reticle to that area.

Note that a "lot" is a concept of a section of the exposure processing operation by the exposure apparatus divided for each plurality of wafers to be processed using the same recipe. For example, the method of defining one lot as 25 wafers and performing an adjustment operation or measurement operation for each component in the apparatus or switching the recipe etc. each time the exposure apparatus processes 25=one lot of substrates may be considered.

When positioning each shot area, the exposure apparatus 200 positions (aligns) each shot area by the EGA system. The "EGA system" referred to here is similar to that explained above.

The exposure apparatus 200 is connected through the LAN 110 to the host computer 140 controlling the exposure system 100 as a whole. It successively processes each lot of wafers based on the instructions from the host computer 140.

Further, the exposure apparatus 200 is provided with alignment conditions or various parameters used for positioning the wafers and shot areas (below, these referred to all together as "alignment conditions (positioning conditions)") from the host computer 140. The exposure apparatus 200 positions the wafers and shot areas based on these alignment conditions.

As the "alignment conditions" referred to here, specifically, the number and array of sample shots, gain adjustment of an imaging device when fetching the alignment mark images, a waveform processing algorithm for analyzing the waveform of the obtained alignment mark images, the calculation equations used for EGA processing, etc. may be mentioned.

As opposed to this, the "various parameters" are a concept including measurement offset due to the hardware of the alignment system. These are sometimes referred to as the "alignment conditions". The "alignment conditions" and "various parameters" referred to here do not have to be particularly strictly differentiated.

The alignment conditions provided from the host computer 140 are determined in advance by a worker analyzing and evaluating information relating to alignment using an alignment data evaluation system on the host computer 140. For this reason, the exposure apparatus 200, in accordance with need, provides data on the results of positioning by the EGA system performed on the exposure apparatus 200 to the alignment data evaluation system on the host computer 140.

The data on the results of positioning by the EGA system is also called the "EGA log data" and includes image data when detecting the marks corresponding to the sample shots selected from the plurality of shots on the substrate, the results of processing when processing the detection image by a predetermined algorithm (for example, the intersecting positions of a predetermined threshold and mark waveforms, position information corresponding to the sample shots determined based on this, etc.), position information of the shots calculated by EGA calculation, etc.

In the present embodiment, the exposure apparatus 200 is made a step-and-scan type projection exposure apparatus (hereinafter referred to as a "scan type exposure apparatus"), but it may also be a step-and-repeat type projection exposure apparatus (stepper).

Note that the detailed configuration of the exposure apparatus 200 will be explained later.

The overlay measuring device 130 measures the overlay error of the wafer on which patterns are formed by the exposure apparatus 200. The overlay measuring device 130 is loaded with a wafer formed with patterns through the exposure processing, detects the measured mark images formed on the loaded wafer (for example, resist images), finds the difference in relative positions between marks formed on the different layers, and detects this as the overlay error.

The overlay measuring device 130 outputs the detected overlay measurement results through the LAN 110 to the host computer 140. The data of this overlay measurement results like the EGA log data detected by the exposure apparatus 200, is provided to the alignment data evaluation system on the host computer 140 and is used for finding the alignment conditions etc. The data of the overlay measurement results for this EGA log data is called the "overlay measurement log data".

The host computer 140 is a computer having a large capacity storage device and a processing device and controls the overall lithography process in the exposure system 100. This large capacity storage device stores the information necessary for overall control of the entire process. Further, the results of processing at the different devices of the exposure system 100 are reported to the host computer 140. This reported information is stored in the large capacity storage device.

Further, the exposure apparatuses 200-1 to 200-n are controlled and managed so as to suitably process each lot based on this information.

Further, the host computer 140 realizes an alignment data evaluation system for finding the alignment conditions in the alignment processing for each exposure apparatus 200-i. That is, it performs processing to collect various information relating to the alignment processing of the exposure apparatus 200, displays and outputs the information of the results by the desired mode in accordance with the requirements of the worker, and thereby assists the worker to determine the alignment conditions.

As the various information relating to the alignment processing, specifically, the EGA log data measured by the exposure apparatus and the overlay measurement log data measured by the overlay measuring device may be illustrated. The EGA log data includes image data when detecting the marks corresponding to the sample shots selected from the plurality of shots on the substrate, the results of processing when processing the detection image by a predetermined algorithm (for example, the intersecting positions of a predetermined threshold and mark waveforms, position information corresponding to the sample shots determined based on this, etc.), position information of the shots calculated by EGA calculation, etc. Further, the overlay measurement log data is the result of controlling a wafer position based on information obtained from EGA, exposing the patterns, loading the substrate in the overlay measuring device, and measuring the positional relationship between overlay measurement marks formed on different layers. The EGA log data takes note of only the results of the alignment system, while the overlay result data can be said to be data including even overlay error due to other than the alignment system, for example, error due to stage correction precision, and error due to the imaging characteristics of the imaging system. The host computer 140 performs processing to collect, that is, analyze the EGA log data measured by the exposure apparatus 200 or overlay measurement log data measured by the overlay measuring device 130 by calculation parameters designated by the worker by a data display unit designated by the worker so as to generate information of the desired display mode designated by the worker so as to enable easy evaluation of the evaluation target and displays this to the worker.

At this time, the host computer 140 performs the EGA simulation and overlay simulation or other simulation in accordance with need, uses this as new analysis data or comparison data, and displays and outputs this to the worker. The analysis data and comparison data will be explained in detail later.

Further, the host computer 140, in accordance with need, reads out various information and various parameters relating to the control of the process when obtaining EGA log data or overlay measurement log data or exposure log data or other information from the stored information, uses them for analysis and evaluation of the alignment conditions or displays, and outputs them to a worker as comparison information and reference information.

The worker successively changes the calculation parameters by for example a dialog type interface with the host computer 140, evaluates the conditions set based on the displayed information, and detects the final best alignment conditions. Further, he sets the detected alignment conditions through the LAN 110 in the exposure apparatus 200 and applies them to the actual wafer processing.

The alignment data evaluation system realized on the host computer 140 provides an interface with the worker or other environment for analysis and evaluation of alignment information for determining these alignment conditions and displaying and outputting information of a desired mode.

Note that this alignment data evaluation system is realized by loading and running a predetermined program including an alignment information display program according to the present invention in a host computer 140. Further, the program may also be installed not in the host computer connected to the exposure apparatus through a LAN, but in a stand alone type computer system. In this case, the EGA log data or overlay measurement log data is input from the different devices using a storage medium to a stand alone type computer system.

The processing of this alignment data evaluation system and the method of evaluation of the alignment information using the same will be explained in further detail below.

Exposure Apparatus

Next, the configuration of an exposure apparatus 200 will be explained with reference to FIG. 2.

Figure 2:
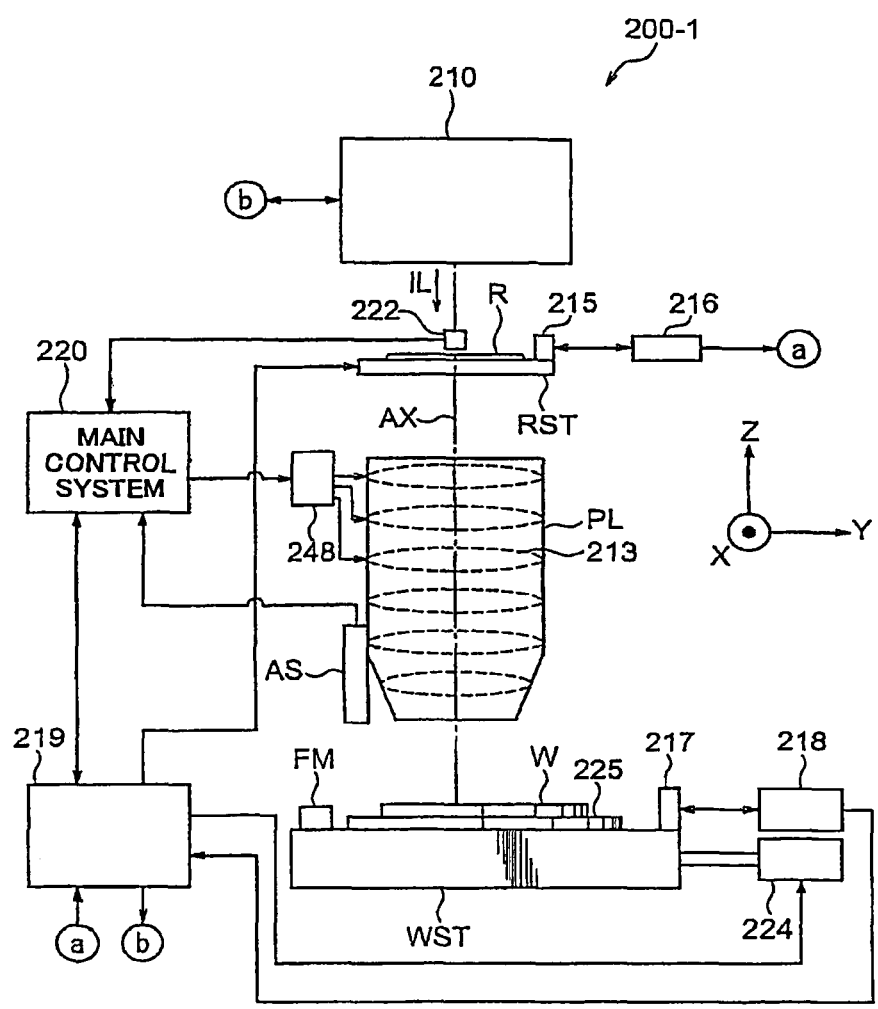
FIG. 2 is a view showing the configuration of an exposure apparatus of the exposure system shown in FIG. 1.

FIG. 2 is a view showing the general configuration of a scan type exposure apparatus, that is, the exposure apparatus 200.

The exposure apparatus 200 has an illumination system 210, a reticle stage RST for holding a reticle R as a mask, a projection optical system PL, a wafer stage WST carrying a wafer W as a substrate, an alignment system AS, and a main control system 220 for overall control of the system as a whole.

The illumination system 210, for example as disclosed in Japanese Patent Publication (A) No. 10-112433, Japanese Patent Publication (A) No. 6-349701, etc., has a light source, an optical integrator comprised of a fly eye lens or rod integrator (inside reflection type integrator) etc. included in an illumination optical system, relay lens, a variable ND filter, a reticle blind, a dichroic mirror, etc. (all not shown). The illumination system 210 illuminates slit-shaped illumination area parts defined by a reticle blind on the reticle R on which circuit patterns etc. are drawn by illumination light IL by a substantially uniform luminance.

Note that as the illumination light IL, KrF excimer laser light (wavelength 248 nm) or other far ultraviolet light, ArF excimer laser light (wavelength 193 nm), F2 laser light (wavelength 157 nm) or other vacuum ultraviolet light, or ultraviolet light from an ultrahigh voltage mercury lamp (g-rays, i-beams, etc.) etc. are used.

The reticle stage RST has a reticle R fastened to it by, for example, vacuum suction. The reticle stage RST can be driven for indexing in the XY plane vertical to the optical axis of the illumination system 210 (matching in optical axis AZ of the later explained projection optical system PL) and can be driven by a designated scan speed in a predetermined scan direction (here, the Y-axial direction) for positioning the reticle R by a not shown reticle stage drive unit comprised of a for example magnetic levitation type two-dimensional linear actuator. Further, the magnetic levitation type two-dimensional linear actuator of the present embodiment is provided with not only an X-drive coil and Y-drive coil, but also a Z-drive coil and can drive the reticle stage RST for indexing in the Z-axial direction.

The position of the reticle stage RST in the plane of movement of the stage is constantly detected by the reticle laser interferometer (hereinafter referred to as the "reticle interferometer") 216 through the movable mirror 215 by a resolution of for example 0.5 to 1 nm or so. The position information of the reticle stage RST from the reticle interferometer 216 is supplied to the stage control system 219 and through that to the main control system 220. The stage control system 219 controls the drive of the reticle stage RST in accordance with instructions from the main control system 220 based on the position information of the reticle-stage RST through a not shown reticle stage drive unit.

Above the reticle R is provided a pair of reticle alignment systems 222 (reticle alignment system at side further past drawing surface not shown). Each of this pair of reticle alignment systems 222, while not shown here, is comprised of an epi-illumination system for illuminating marks for detection by illumination light of the same wavelength as the illumination light IL and an alignment microscope for capturing images of the marks for detection. The alignment microscope includes an imaging optical system and an imaging device. The imaging results from the alignment microscope are supplied to the main-control system 220. In this case, a not shown deflection mirror for guiding detection light from the reticle R to the reticle alignment system 222 is arranged to be movable. When the exposure sequence is started, the deflection mirror is retracted outside the path of the illumination light IL together with the reticle alignment system 222 by an instruction from the main control system 220 by a not shown drive device.

The projection optical system PL is provided below the reticle stage RST in FIG. 2. The direction of this optical axis AX is made the Z-axial direction. As the projection optical system PL, for example, a double telecentric reduction system is used. The projection power of this projection optical system PL is for example ¼, ⅕, ⅙, etc. For this reason, when the illumination light IL from the illumination system 210 illuminates the illumination area of the reticle R, the illumination light IL passing through this reticle R passes through the projection optical system PL to form reduced images of circuit patterns of the reticle R in the illumination area (partially laid down image) on the wafer W coated on its surface with a resist (photosensitizer).

As the projection optical system PL, as shown in FIG. 2, a refraction system comprised of only a plurality of, for example, 10 to 20, refractive optical elements (lens elements) 213 is used. Among the plurality of lens elements 213 forming this projection optical system PL, the plurality of lens elements on the object surface side (reticle R side) comprise movable lenses able to be driven by not shown drive devices, for example, piezoelectric devices, to shift in the Z-axial direction (optical path direction of the projection optical system PL) and tilt in the tilt direction with respect to the XY plane (that is, in the rotation direction around the X-axis and the rotation direction around the Y-axis). Further, the imaging characteristic correction controller 248 independently adjusts the voltages applied to the drive devices based on the instructions from the main control system 220 so as to independently drive the movable lenses and adjust the various imaging characteristics (power, distortion, astigmatism, coma aberration, field curvature, etc.) of the projection optical system PL. Note that the imaging characteristic correction controller 248 can control the light source to shift the center wavelength of the illumination light IL and can adjust the imaging characteristics by the shift of the center wavelength in the same way as movement of the movable lens.

The wafer stage WST is arranged below the projection optical system PL in FIG. 2 and above a not shown base. This wafer stage WST carries a wafer holder 225. This wafer holder 225 has a wafer W fastened on it by for example vacuum suction etc.

The wafer holder 225 can be tilted by a not shown drive unit in any direction with respect to the plane perpendicular to the optical axis of the projection optical system PL and can be indexed in the optical axis AX direction of the projection optical system PL (Z-axial direction). Further, this wafer holder 225 can also rotated by indexing around the optical axis AX.

The wafer stage WST is configured to be able to not only move in the scan direction (Y-axial direction), but also move in the non-scan direction (X-axial direction) perpendicular to the scan direction so as to enable a plurality of shot areas on the wafer to be positioned at exposure areas conjugate with the illumination area and repeats an operation for scan exposure of each shot area on the wafer W and an operation for accelerating and moving to the start position for exposure of the next shot area for a step-and-scan operation. This wafer stage WST is driven in the XY two-dimensional directions by for example a wafer stage drive unit 224 including a linear motor etc.

The position of the wafer stage WST in the XY plane is constantly detected through a movable mirror 217 provided on the top surface by a wafer laser interferometer system 218 by a resolution of for example 0.5 to 1 nm.

The wafer stage WST is provided on it with a Y-movable mirror having a reflection surface perpendicular to the scan direction (Y-direction) and an X-movable mirror having a reflection surface perpendicular to the non-scan direction (X-axial direction). Corresponding to this, the wafer laser interferometer 218 is also provided with a Y-interferometer for emitting an interferometer beam vertical to the Y-movable mirror and an X-interferometer for emitting an interferometer beam vertical to the X-movable mirror (In FIG. 2, these are shown typically as a movable mirror 217 and wafer laser interferometer system 218). Further, the stationary coordinate system (orthogonal coordinate system) defining the moving position of the wafer stage WST is defined by the measurement axes of the Y-interferometer and X-interferometer of the wafer laser interferometer system 218. (Below, this stationary coordinate system will be referred to as the "stage coordinate system" in some cases.)

Note that the end face of the wafer stage WST may be polished to a mirror surface to form the reflection surface of the interferometer beams.

The position information (or speed information) of the wafer stage WST on the stage coordinate system is supplied through the stage control system 219 to the main control system 220. The stage control system 219 controls the wafer stage WST in accordance with an instruction of the main control system 220 based on the position information (or speed information) of the wafer stage WST through the wafer stage drive unit 224.

Further, a fiducial mark plate FM is fastened near the wafer W on the wafer stage WST. The surface of this fiducial mark plate FM is set to the same height as the surface of the wafer W. This surface is formed with fiducial marks for so-called base line measurement of the later explained alignment system, fiducial marks for reticle alignment, and other fiducial marks.

An off-axis type alignment system AS is provided at the side surface of the projection optical system PL. As this alignment system AS, here, for example, an alignment sensor such as disclosed in Japanese Patent Publication (A) No. 2-54103 (Field Image Alignment (FIA) system) is used. This alignment system AS emits illumination light having a predetermined wavelength band (for example, white light) on the wafer and forms the images of the alignment marks on the wafer and images of index mark on an index plate arranged in the plane conjugate with the wafer on the light receiving surface of the imaging device (CCD camera etc.) by an object lens etc. for detection. The alignment system AS outputs the imaging results of the alignment marks (and fiducial marks on the fiducial mark plate FM) to the main control system 220.

The exposure apparatus 200 is provided with an oblique incidence type multipoint focus detection system, comprised of a not shown illumination optical system supplying focused light for forming a plurality of slit images toward a best focus plane of the projection optical system PL in an oblique direction from the optical axis AX direction and a not shown light receiving optical system receiving the focused light reflected at the surface of the wafer W through the slits, fastened to a support part supporting the projection optical system PL (not shown). As this multipoint focus detection system, for example one of a similar configuration to that disclosed in Japanese Patent Publication (A) No. 5-190423, Japanese Patent Publication (A) No. 6-283403, etc. is used. The stage control system 219 drives the wafer holder 225 in the Z-axial direction and tilt direction based on the wafer position information from this multipoint focus detection system.

The main control system 20 is comprised of a microcomputer or other processing system and controls the different components of the exposure apparatus. The main control system 220 is connected to the above-mentioned LAN 110. Further, the alignment conditions or other information set from the host computer 140 are stored in a hard disk or other storage device or RAM or other memory forming the main control system 220.

Alignment System

Next, the configuration of the alignment system AS will be explained with reference to FIG. 3.

Figure 3:
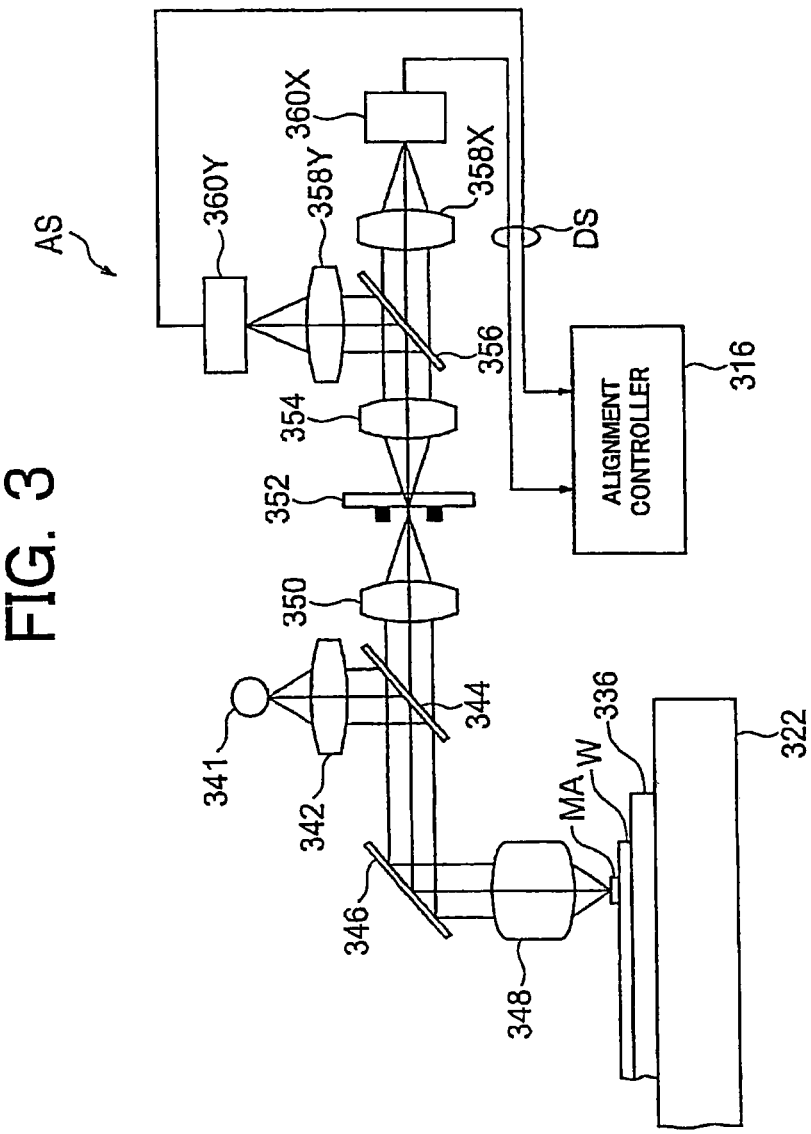
FIG. 3 is a view showing the configuration of an alignment system of the exposure apparatus shown in FIG. 2.

As shown in FIG. 3, the alignment sensor AS has a light source 341, collimator lens 342, beam splitter 344, mirror 346, object lens 348, condensing lens 350, index plate 352, first relay lens 354, beam splitter 356, X-axis second relay lens 358X, X-axis imaging device 360X comprised of a two-dimensional CCD, Y-axis second relay lens 359Y, and Y-axis imaging device 360Y comprised of a two-dimensional CCD.

As the light source 341, a light source emitting nonphotosensitive light not sensitizing the photoresist on the wafer and having a broad wavelength distribution having a certain bandwidth (for example, 200 n or so), here, a halogen lamp. Broadband illumination light is used to prevent the drop in mark detection accuracy due to thin film interference at the resist layer.

The illumination light from the light source 341 is emitted through the collimator lens 342, beam splitter 344, mirror 346, and object lens 34B to near the alignment marks MA on the wafer W. Further, the reflected light from an alignment mark MA is emitted through the object lens 348, mirror 346, beam splitter 344, and condensing lens 350 to the index plate 352 whereby an image of the alignment mark MA is formed on the index plate 352.

Light passing through the index plate 352 passes through the first relay lens 354 and heads to the beam splitter 356. The light passing through the beam splitter 356 is focused by the X-axis second relay lens 358X on the imaging plane of the X-axis imaging device 360X. The light reflected by the beam splitter 356 is focused by the Y-axis second relay lens 358Y on the imaging plane of the Y-axis imaging device 360Y. Images of the alignment mark MAn and images of the index mark on the index plate 352 are formed overlaid on the imaging planes of the imaging devices 360X and 360Y. The imaging signals (DS) of the imaging devices 360X and 360Y are both supplied to the main control system 220.

The main controller 220 is supplied with the measurement values of the wafer laser interferometer 218 through the stage control system 219. Therefore, the main controller 220 calculates the position of the alignment mark MA on the stage coordinate system based on the imaging signal DS from the alignment sensor AS and the measurement value of the wafer laser interferometer 218.

Alignment Data Evaluation System

Next, the alignment data evaluation system according to the present invention realized on the host computer 140 for assisting determination of the alignment conditions and the display method and evaluation method of the alignment data (alignment information) using the same will be explained with reference to FIG. 4 to FIG. 23.

First, the flow of processing of the program (alignment data evaluation sequence) executed as the alignment data evaluation system will be explained with reference to FIG. 4.

Figure 4:
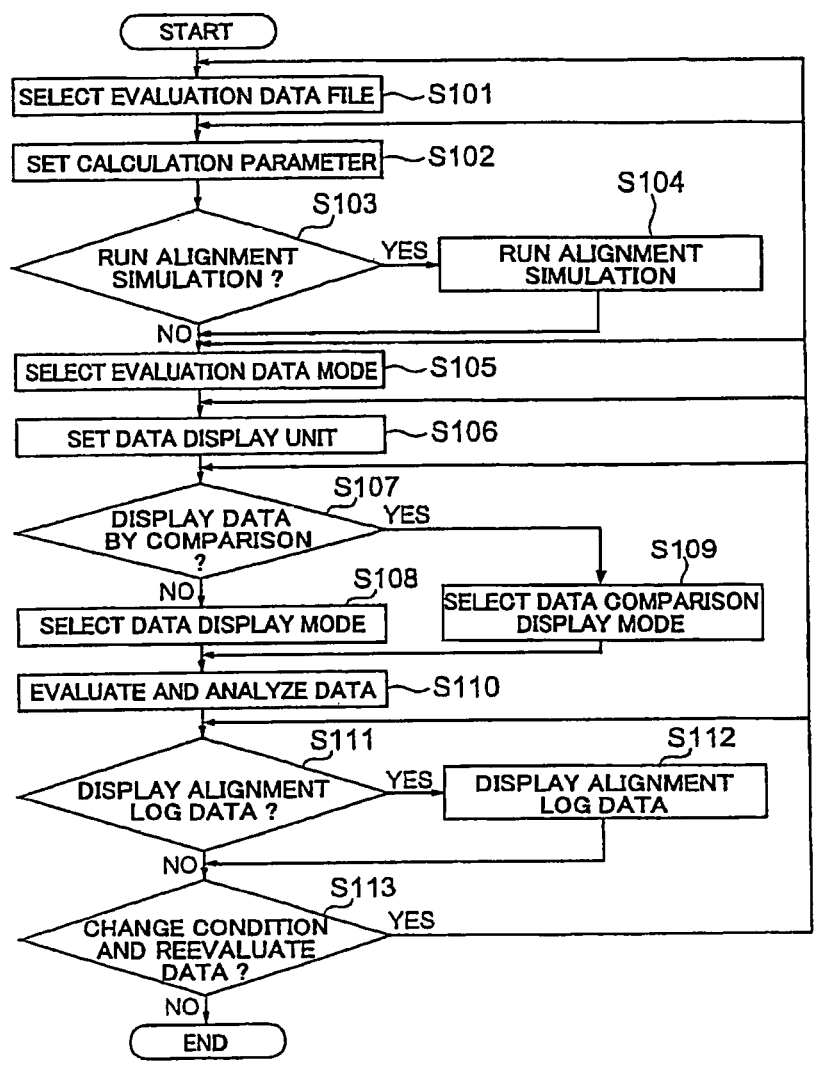
FIG. 4 is a flowchart showing an alignment data evaluation sequence.

FIG. 4 is a flowchart showing the alignment data evaluation sequence.

In evaluation of the alignment data (alignment information),
first, the EGA log data or overlay measurement log data to be evaluated is selected by a file unit (step S101). A plurality of files to be evaluated may also be designated.

Next, the EGA calculation model (including higher order model), reject allowance, shots for EGA calculation, wafer for measurement, or other alignment conditions is set (step S102).

Note that as the EGA calculation model, in addition to model equations such as equation 1 handling changes in the shot array on the substrate as being linear, higher order calculation model equations able to handle even the nonlinear component or random component of the change in array are prepared.

The "reject allowance" means the boundary condition for determining whether to remove a shot from the EGA calculation when there is a shot with an extremely large position deviation compared with other shots as a result of detection of the positions of the sample shots for the EGA calculation. EGA calculation is statistical calculation for finding the shot positions of the shots for a substrate as a whole based on the information of the positions of a small number of sample shots on the substrate, so if the small number of sample shots forming the basis of the EGA calculation includes a shot with local position deviation, it might have a detrimental effect on the information of the positions of the shots of the substrate as a whole.

The deviation of the shot position depends on the cause. The change in trend in the position deviation for each substrate is sometimes large and sometimes small. When the change in trend of the position deviation for each substrate is small, there is no particular problem even if using information obtained from the head substrate of the lot for alignment processing of the lot as a whole or a plurality of lots, but when the change in trend is large, it is sometimes also possible to adjust the alignment conditions at smaller intervals. The "wafer for evaluation" referred to in the alignment conditions means the alignment condition relating to at what interval to perform the alignment measurement, adjustment operation, etc. in balance with these changes in trend.

At this time, when opening an alignment waveform file storing data on the signal waveforms corresponding to mark images obtained from image data obtained by an imaging device for EGA simulation, signal processing conditions or other alignment conditions such as the mark shape or waveform processing algorithm are also set.

Further, other than evaluating and analyzing overlay measurement log data alone, when performing overlay simulation based on the overlay measurement log data and the results of EGA simulation, the results of EGA simulation are added to the overlay measurement log data. In this case, the content which should be added includes the settings of the change in EGA correction amount by EGA simulation, the EGA component correction conditions (alignment correction value, EGA result selection, etc.), and processing conditions of EGA option functions (expanded EGA, weighted EGA, etc.)

Note that the amount of change of the EGA correction amount due to EGA simulation is sometimes calculated by alignment mark waveform detection simulation and is sometimes calculated using the difference of the correction amounts of the two different EGA measurement result files.

Next, it is judged if running a simulation has been designated (step S103) or a designation for running it has been received. If running a simulation has been designated or designation has been received, a simulation is run based on the set conditions (step S104). At this time, it is possible to run a simulation under a plurality of conditions for a single evaluation target.

When running a simulation is not designated (step S103), the routine proceeds to step S105 without running the simulation of step S104.

Next, the evaluation target is selected (step S105). The evaluation target is selected from the measurement value, correction value, residual component after correction, image of the mark, or data relating to the waveform included in the EGA or overlay measurement log data selected by the file unit at step S101, the results of simulation found at S104, etc.

Next, the data display unit is set (step S106). The data display unit is selected and set in any combination from among each plurality of lots, each single lot, each plurality of wafers, each single wafer, each plurality of shots, each single shot, each plurality of marks, or each single mark. By this setting, it is possible to designate data between a plurality of lots for example for a plurality of shots in a specific area of a specific wafer.

Next, the existence of designation of execution of comparison display of data is judged. If comparison display is designated, the routine proceeds to step S109, while if comparison display of data is not designated, the routine proceeds to step S108 (step S107).

At step S108, the evaluation target selected at step S105 is displayed by the data display unit set at step S106 by the desired display mode. The display mode is suitably selected from numerical data display, vector data display, histogram-scatter diagram or other statistical display, sort result display, waveform data display, or another mode.

In numerical data display, data of the evaluation target is displayed by numerical display. In numerical display, it is of course possible to list data obtained from the log data file of the evaluation target as it is, but it is also possible to display the numerical values after statistical calculation in accordance with the data display unit or display them sorted in descending order, ascending order, etc. For example, when selecting "each single lot" as the display unit, the average, dispersion, error, etc. for a plurality of data of the plurality of substrates in each single lot is found and the data displayed for each lot as numerical values corresponding to each lot.

The "vector display", is a display mode displaying the direction and magnitude of change of a shot on a substrate by vectors on a screen. According to this vector display, it is possible display the design position of a shot, the position of a shot moved due to process processing, deviation remaining even after positioning (residual error), or other relationships.

A "histogram" is a display mode showing the selected display unit along the abscissa and showing the corresponding numerical data by the length in the ordinate direction of the graph. In the same way as the case of numerical data, it is possible to display the data obtained from the log data file of the evaluation target as it is replaced by the length of the graph or display numerical values after statistical calculation in accordance with the data display unit replaced by the length of the graph.

A "sort" displays the evaluation data sorted for each simulation number, each mark, each shot, each wafer, or another unit among the set data display units for the selected evaluation mode. That is, the data is displayed in order of magnitude for x, y, x and y and x or y.

Further, a scatter diagram is used when desiring to view the correlation between two parameters such as the movement in the offset factors when, for example, changing the algorithm slice level. When displaying a scatter diagram of the plurality of data on a single screen, if applying a regression curve for each data, understanding the correlation with the slice level for each data becomes easy. Further, in this regression analysis, a linear line, logarithmic curve, polynomial curve, power curve, or exponential curve is selected in accordance with the data covered.

The "algorithm slice level" means the constant level set for the waveform data based on the image data of an obtained mark. By finding the intersection of this constant level and waveform data, that is, by finding the position where waveform data exceeds (or falls below) a constant level, it is possible to obtain mark position information. By changing this constant level, sometimes the mark position information determined based on this changes.

Further, the "offset factor" here means the same as residual error information. As explained above, changing the slice level changes the mark position information, so the residual error remaining between the actual mark position and the calculated mark position calculated by the EGA calculation also changes in accordance with a change in the slice level.

On the other hand, at step S109, two or more data assembled in units selected at step S105 and set at step S106 are displayed by comparison display by the data display unit set at step S106 on the data display unit. The display mode is suitably selected from a numerical data display, vector data display, histogram-scatter diagram or other statistical display, sort result display, waveform data display, or another mode.

For example, when changing the EGA calculation model for the same evaluation data file, evaluation target, and data display unit (for example, second order to third order), this comparison display is effective when comparing and analyzing if there is a significant difference in the results of alignment correction.

In the present embodiment, the method for comparison and display of data is selected from the vector correlation method, difference method, and comparison (overlay) method.

Below, each comparison and display method will be explained.

Comparison Display of Map Data by Vector Correlation Method

The vector correlation method calculates the internal sum of products of the vector Sij and vector Tij for each measurement point position between the reference wafer vector map pattern S and comparison wafer vector map pattern T based on equation (3) to find the correlation. Due to this, correlation considering both the direction and magnitude between the vector map S and vector map T is obtained.

Note that the vector S or vector T is a value of the evaluation target selected at step S105 of FIG. 4 (measurement value/correction value/residual error after correction, or other value for each alignment mark measurement position) and is displayed in a map based on the data display data set at step S106 of FIG. 4. That is, the vector correlation method expresses the degree of similarity between two objects for evaluation able to be expressed by a vector by numerical values or graphically. As one example, if the correlation is high between the change in position from the origin of the measurement position (design position) and the calculated change in position found by EGA calculation based on the measurement value is high, it is possible to confirm the effectiveness of this EGA calculation. By finding the correlation between the vector map showing the measurement position and the vector map according to the position information found by EGA calculation, it is possible to determine the appropriateness of the conditions set for EGA calculation. Further, equation (3) to equation (6) relate to the overall vector correlation in wafer units etc. for a plurality of marks.

[Equation 3]

$$\rho_{v0} = (1/(M \times N)) \sum_{i=1}^{M} \sum_{j=1}^{N} (\vec{T}_{ij} \cdot \vec{S}_{ij}) \quad (3)$$

$$= (1/(M \times N)) \sum_{i=1}^{M} \sum_{j=1}^{N} (|\vec{T}_{ij}||\vec{S}_{ij}|\cos\theta_{ij})$$

$$= (1/(M \times N)) \sum_{i=1}^{N} \sum_{j=1}^{N} (\vec{T}_{Xij}\vec{S}_{Xij} + \vec{T}_{Yij}\vec{S}_{Yij})$$

Figure 5:
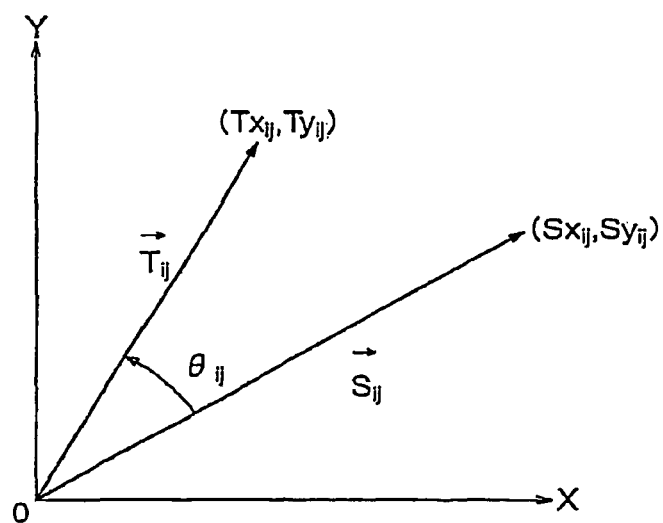
FIG. 5 is a view for explaining vector correlation.

That is, as shown in FIG. 5, if obtaining the maximum value of the internal sum of products of the vectors Sij, Tij, vector Sij=Tij, that is, the directions and magnitudes of the vector maps match. Conversely, if the internal sum of products of the vectors Sij, Tij is 0, it is learned that the vectors Sij and Tij lack any correlation. Note that a high correlation shows that the change between wafer vector maps is small. Conversely, a low correlation shows that the change between wafer vector maps is large.

Here, as shown in equation (4), by dividing the internal sum of products of the vector Sij and vector Tij found by the equation (3) by each of the magnitude of the vector Sij found from equation (5) and the magnitude of the vector Tij found from equation (6), a correlation coefficient CV0 normalized in magnitude of the vector is calculated.

[Equation 4]

$$C_{v0} = \rho_{v0} / \{(\sigma_{T0})(\sigma_{S0})\} \quad (4)$$

[Equation 5]

$$\sigma_{S0} = \sqrt{\{(1/(M \times N)) \sum_{i=1}^{M} \sum_{j=1}^{N} (\vec{S}_{ij})^2\}} \quad (5)$$

$$= \sqrt{\left\{(1/(M \times N)) \sum_{i=1}^{M} \sum_{j=1}^{N} (S_{Xij}^2 + S_{Yij}^2)\right\}}$$

[Equation 6]

$$\sigma_{T0} = \sqrt{\{(1/(M \times N)) \sum_{i=1}^{M} \sum_{j=1}^{N} (\vec{T}_{ij})^3\}} \quad (6)$$

$$= \sqrt{\left\{(1/(M \times N)) \sum_{i=1}^{M} \sum_{j=1}^{N} (T_{Xij}^2 + T_{Yij}^2)\right\}}$$

The value of the correlation coefficient CV0 ranges from −1 to +1. When +1, it shows that the vectors match in direction and magnitude (no change), when −1, it shows that the vectors are inverted in direction 180°, and when 0, it shows that the vectors are not correlated in direction and magnitude (large change).

Due to this, it is possible to evaluate and judge the correlation between wafer vector maps, that is, the significant difference between the compared data (amount of change), by a certain yardstick.

Further, rather than make an overall comparison such as the sum of squares of the residual differences, each measured position may be evaluated.

Figure 6:
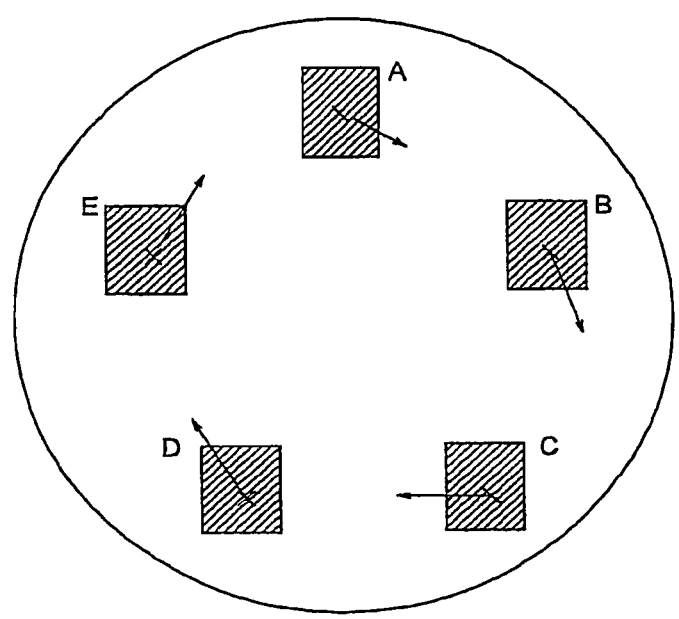
FIG. 6 is a view of an example of a wafer vector map.

As the wafer vector map showing correlation between the compared data, as shown in FIG. 6, the vector value is calculated for each measured position based on equation (7) and equation (10) and displayed as a vector map. This is the correlation value for each measured position obtained by dividing the internal sum of products of the vector into the XY components and normalizing them by the magnitude of the vector.

Further, the square root of the sum of squares of equation (7) and equation (10), that is, the internal sum of products defined for each measured position shown in equation (13), may be displayed as a 3D standing bar graph on a wafer map.

[Equation 7]

$$V_{Xij} = (\vec{T}_{Xij}\vec{S}_{Xij})/\{(\sigma_{TX0})(\sigma_{SX0})\} \quad (7)$$

[Equation 8]

$$\sigma_{TX0} = \sqrt{\left\{(1/(M \times N))\sum_{i=1}^{M}\sum_{j=1}^{N}(\vec{T}_{Xij}^2)\right\}} \quad (8)$$

[Equation 9]

$$\sigma_{SX0} = \sqrt{\left\{(1/(M \times N))\sum_{i=1}^{M}\sum_{j=1}^{N}(\vec{S}_{Xij}^2)\right\}} \quad (9)$$

[Equation 10]

$$V_{Yij} = (\vec{T}_{Yij}\vec{S}_{Yij})/\{(\sigma_{TY0})(\sigma_{SY0})\} \quad (10)$$

[Equation 11]

$$\sigma_{TY0} = \sqrt{\left\{(1/(M \times N))\sum_{i=1}^{M}\sum_{j=1}^{N}(\vec{T}_{Yij}^2)\right\}} \quad (11)$$

[Equation 12]

$$\sigma_{SY0} = \sqrt{\left\{(1/(M \times N))\sum_{i=1}^{M}\sum_{j=1}^{N}(\vec{S}_{Yij}^2)\right\}} \quad (12)$$

[Equation 13]

$$V_{ij} = \sqrt{(V_{Xij}^2 + V_{Yij}^2)} \quad (13)$$

When desiring to judge the residual error after EGA correction as a whole by the magnitude of the residual error vector, the calculated value σS0 of the equation (5) is used designating the X-direction residual component in the mark measurement position as Sxij and the Y-direction residual component as Syij.

In the vector correlation method, both the XY direction and magnitude of the evaluation data are considered, so understanding and evaluation of the two-dimensional data are facilitated. Further, by normalizing the data, it is possible to extract and evaluate just the pure degree of change without being affected by the absolute value differing for each data for comparison and possible to judge any significant difference between data (amount of change) by a constant evaluation yardstick.

Further, in addition to an overall comparison by wafer units etc. for a plurality of marks shown in equation (3) to equation (6), comparison and judgment by vector maps normalized for each mark measurement position shown in equation (7) to equation (12) become possible.

Further, if using equation (5), equation (6), equation (8), equation (9), equation (11), and equation (12), it is possible to make an overall comparison and judgment by the magnitude of the evaluation data.

Comparison Display of Data by Difference Method

The comparison display of data by the difference method is the method of displaying the difference between two data of designated evaluation modes by a selected display mode such as the set data display unit, numerical data display, vector data display, histogram-scatter diagram, other statistical display, etc. Due to this, it is possible to evaluate the type of difference between two data in the form of a vector map display, numerical data display, or other mode for each measurement position. Note that usually the overall evaluation yardstick used is the sum of square of differences.

Further, to evaluate the change of the data at each measured position, the range of difference between the plurality of data (range) for each measurement position or each data display unit, variation (dispersion and standard error), and shape of distribution (skewness, kurtosis) are calculated and displayed. The skewness shows the symmetry of the distribution and is calculated by equation (14). The kurtosis shows the length of the skirts of the distribution and is calculated by equation (15).

When evaluating the change between a plurality of data of the mark measurement positions, the better the symmetry of the distribution and the shorter the lengths of the skirts the better. It is preferable to use the skewness (the closer the b1 of equation (14) to 0, the stronger the symmetry and therefore the more preferred) or the kurtosis (the larger the b2 of equation (15), the shorter the length of the skirts and therefore the more preferred) for evaluation.

[Equation 14]

$$\text{SKEWNESS:} b_1 = [n/\{(n-1)(n-2)\}]\sum_{i=1}^{n}\{(X_1 - \overline{X})/S\}^3 \quad (14)$$

$b_1=0$:Symmetry
$b_1>0$:Skirt becomes longer toward right direction
$b_1<0$:Skirt becomes longer toward left direction

[Equation 15]

$$\text{SKEWNESS:} b_2 = [n(n+1)/\{(n-1)(n-2)(n-3)\}] \cdot \quad (15)$$
$$\sum_{i=1}^{n}\{(X_1 - \overline{X})/S\}^4 - 3 \times (n-1)^2/\{(n-2)(n-3)\}$$

$b_2=0$:Normal Distribution Type
$b_2>0$:Skirt is short
$b_2<0$:Skirt is long

Comparison Display of Data by Comparison/Overlay Method

The comparison display of data by the comparison/overlay method is the method of evaluating the data of the designated evaluation target by comparison display or overlay display in the set data display units by a display mode selected from the numerical data display, vector data display, histogram-scatter diagram, or other statistical display, sort result display, and waveform data display, or other display mode.

Normally, comparison display is suitable for numerical data, sort results, etc. Further, overlay display is preferable for vector data, a histogram, scatter diagram, waveform data, etc.

Due to this, the difference between two or more data can be efficiently evaluated. In particular, for map display of vector data, waveform data, and nonlinear correction amounts at the time of higher order correction, the differences between the different conditions become easily understandable if displaying the display data for the different conditions overlaid.

Returning to the flowchart shown in FIG. 4, after the display mode of the data finishes being selected at step S108 or step S109, the displayed data is evaluated and analyzed (step S110).

At this time, when the evaluation data is the correction value or residual component after correction, the individual alignment conditions can be individually designated. When the EGA calculation model is a higher order model, each higher order correction coefficient can be designated. Further, the correction value can be designated for each wafer and for each lot (average of correction value of plurality of wafers).

Next, it is judged if display of the alignment processing log data is designated (step S111). If designated, the alignment conditions, measurement status, measurement . . . error information, or other alignment processing log data is displayed (step S112). It is effective to display this alignment processing log data when waveform detection error occurs, when there is an anomaly in the measurement results, etc. When the cause of the waveform detection error or the anomaly in the measurement results is at the hardware side, waveform detection error or an anomaly in the measurement results will be confirmed at the same positions of a plurality of wafers. Therefore, by confirming the log data, a hint is obtained for pinpointing that the cause is at the hardware side.

Next, when changing the conditions, detecting designation as to whether to perform reevaluation-analysis, and performing reevaluation or reanalysis, the routine returns to the designated step position (step S101, S102, S105, S106, S107, or S111) and the evaluation sequence is repeated (step S113).

By proceeding with processing by such a sequence, it is possible to efficiently evaluate and analyze alignment conditions and optimize the alignment conditions.

Input/Output Screen Display

Next, an input/output screen in such an alignment data evaluation system is specifically illustrated. The operation of the alignment data evaluation system and the method of determination of the alignment conditions using this system will be explained.

First, the alignment condition setting screen for the alignment data evaluation system will be explained.

Note that the alignment system AS of FIG. 3 includes an FIA (Field Image Alignment) type alignment sensor. Further, while the explanation of the alignment system using FIG. 3 is omitted, the alignment system AS also includes an LSA (Laser Step Alignment) type alignment sensor. Each system is already being extensively used, so detailed explanations of these will be omitted.

Figure 7:
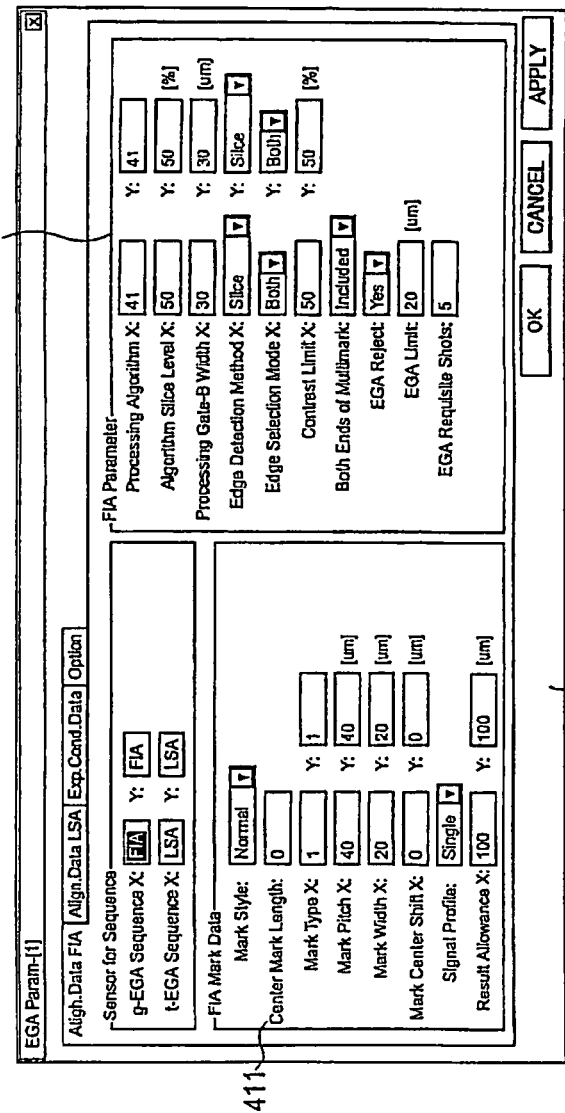
FIG. 7 is a view of an example of an FIA EGA parameter setting screen.

FIG. 7 is a view of the EGA parameter setting screen for an FIA type alignment sensor. Using the setting screen 410 shown in FIG. 7, a worker sets processing conditions of an FIA mark waveform generated based on the image of a mark on a substrate obtained as image data. Specifically, for example, he sets the FIA mark shape information in the FIA mark data field 411 and sets the signal processing conditions in the FIA parameter field 412. Further, EGA simulation is run based on the settings from this screen.

As the signal processing conditions, for example, the method of setting a threshold value for the FIA mark waveform may be mentioned. In FIA type alignment, mark position information is found from the position of intersection of the waveform and threshold value. As the method of setting this threshold value, it is possible to change what portion of the waveform to use or what height to set the threshold value at or otherwise change the settings.

Figure 8:
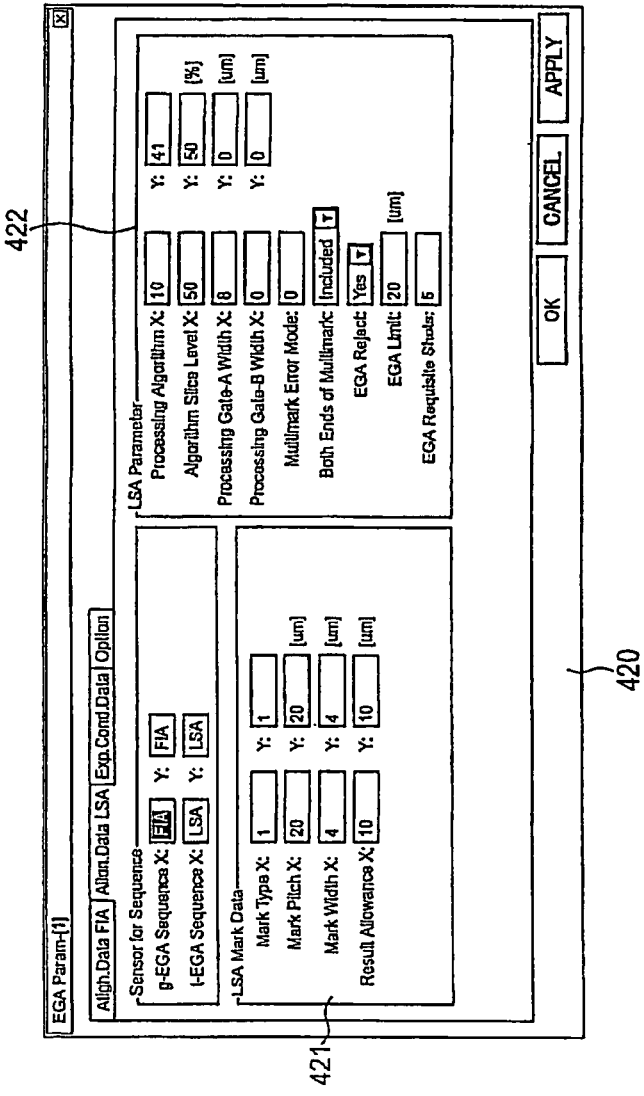
FIG. 8 is a view of an example of an LSA EGA parameter setting screen.

FIG. 8 is a view showing a EGA parameter setting screen for an LSA type alignment sensor. Using the setting screen 420 shown in FIG. 8, a worker can set processing conditions of an LSA mark waveform.

Specifically, for example, he sets the LSA mark shape in the LSA mark data field 421 and set the signal processing conditions in the LSA parameter field 422. Further, EGA simulation is run based on the settings from this screen.

Figure 9:
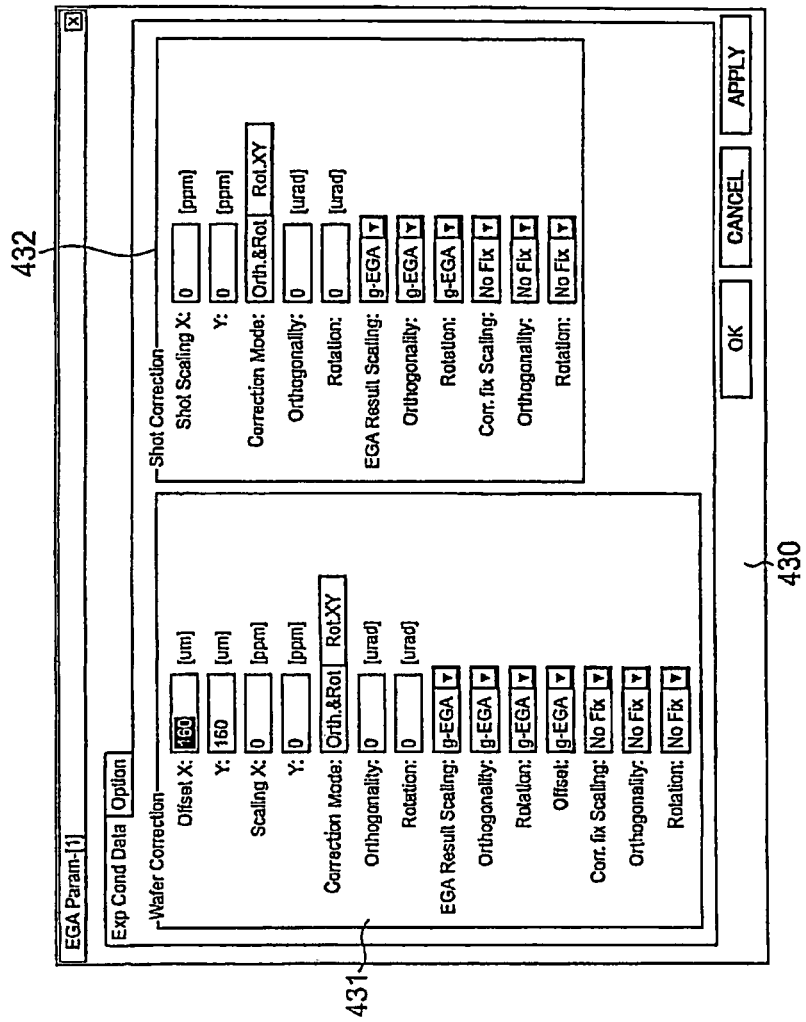
FIG. 9 is a view of an example of wafer exposure condition (overlay condition) parameter setting screen.

FIG. 9 is a view showing a wafer exposure condition setting screen. Using the setting screen 430 shown in FIG. 9, a worker can set wafer exposure conditions and parameters.

The wafer exposure condition setting screen 430 has a wafer correction parameter setting field 431 and a shot correction parameter setting field 432. Further, using these fields, the worker sets the correction amounts for addition to the correction factors of the wafers and shots calculated in the EGA calculation, sets whether to use fixed values rather than using the results of calculation calculated by the EGA system (designates. "No Fix" or "Fix" for each correction factor), selects the EGA results when using the values calculated based on the EGA parameters, etc. Further, he runs an overlay simulation based on the settings from this screen. A wafer correction parameter is a setting of the correction amount set for each wafer, while a shot correction parameter is a setting of the correction amount set for each shot.

Next, screens for display and output of various types of data from the alignment data evaluation system will be explained.

Figure 10:
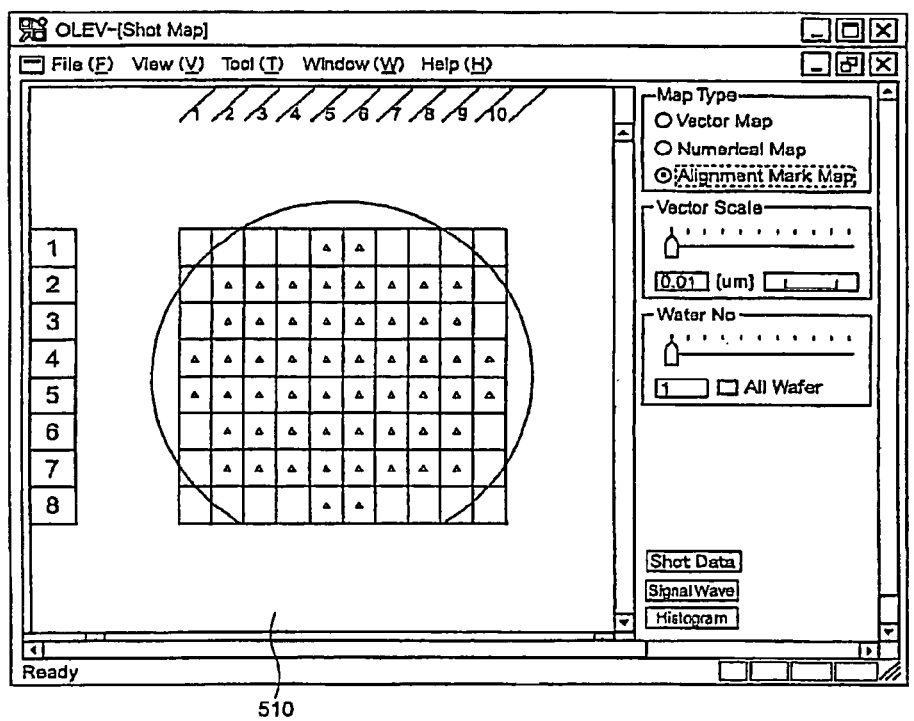
FIG. 10 is a view showing an example of display output of information according to the present invention and shows a wafer alignment mark map display screen.

FIG. 10 is a view of an alignment mark map display screen.

The window 510 shown in FIG. 10 displays a view showing the position of a shot (mark) for evaluation on a wafer. The wafer for evaluation wafer is any wafer of any lot selected by a worker from EGA log data or overlay measurement log data for evaluation.

To evaluate the alignment results and determine more suitable alignment conditions, for example, it is effective to display an image clearly showing the position of the shot for evaluation on the wafer by the mode shown in FIG. 10 and evaluate the different data successively in the following processes.

In the present embodiment, for example, by selecting the desired shot in this window 510 by double clicking on that location or performing another operation, for example the waveform data or other desired detail data (information) regarding the shot (mark) is displayed.

Figure 11:
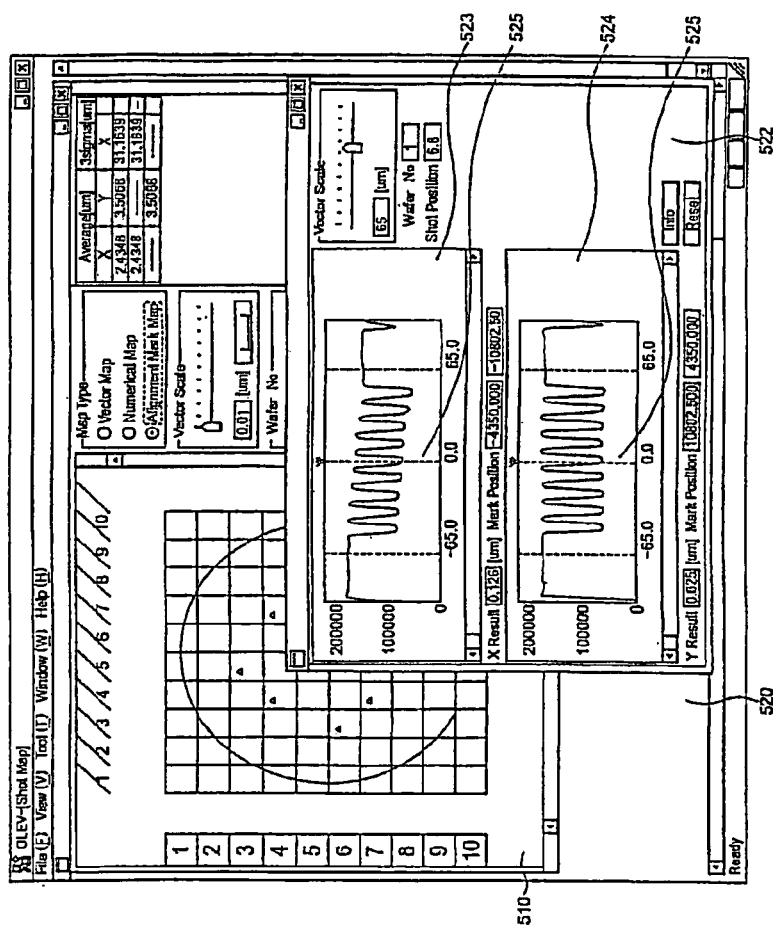
FIG. 11 is a view showing an example of display output of information according to the present invention and shows a screen on which a diagram showing alignment mark positions and a chart comparing waveform data are displayed.

FIG. 11 is a view of a display screen for displaying alignment mark maps and waveform data.

The screen 520 shown in FIG. 11 displays a window 510 displaying a map of the positions of shots (marks) on a wafer shown in FIG. 10 and a window 522 displaying waveform data of a specific alignment mark.

This screen 520, as explained before, is generated by selecting a desired shot on the alignment mark map shown in for example FIG. 10. In this case, while not shown, a shot (mark) for which waveform data is displayed in the window 522 is displayed by a mode enabling it to be discriminated from other shots (marks) in a window 510.

The window 522 displays the waveform data (waveform diagram) 523 of a mark for analysis and for evaluation in the shots whose positions are displayed in the window 510 by a mode for comparison with waveform data (waveform diagram) 524 of normal mark detection. In the waveform diagrams 523 and 524, the center vertical lines 525 show the center positions of marks determined by analysis of the waveform data by a predetermined waveform analysis algorithm. At the bottom left of each waveform graph, the measurement value (amount of deviation from design value) is shown.

Note that the waveform data 524 of normal mark detection may be selected from shots (marks) shown in the window 510 or may be previously prepared reference data for a mark of the same shape as the mark for analysis.

By such a display, it is possible to display the waveform for any mark of any lot, any wafer, or any shot. Further, by for example displaying normal waveform data or other waveform data for comparison, it is possible to deduce the cause of waveform detection error from the points of difference.

Note that the two waveform data of the window 522 may be displayed overlaid (overlay display). It is also possible to select and display any easily viewable display method in accordance with the type and state of the waveform.

Further, to facilitate viewing of points of difference on such a comparison display screen, it is possible to change the color, thickness, and shape (solid lines and broken lines etc.) of the waveforms between the waveforms displayed by comparison display or overlay display.

This display mode is not limited to comparison display of an evaluation mark waveform and a reference mark waveform and can be used for comparison of various types of waveform data.

For example, it is possible to display the waveform for each change of detection parameter by comparison display or overlay display when changing the detection parameter for the same mark waveform data. By such a display, it is possible to deduce the effect which a change in a parameter will have on the detection position of a mark waveform from the points of difference between the two data displayed by comparison or overlay display.

Further, it is also possible to display the X-direction waveform and Y-direction waveform for the same mark or between any different marks by comparison display.

Further, by detecting error etc. of waveform data from such a display screen, for example, it is possible to easily and suitably change EGA parameters and change shot positions or mark position covered by EGA (eliminate shots or marks with unstable mark waveform shapes). As a result, it is possible to suitably take measures against mark detection error and improve the mark detection accuracy.

Note that mark shape parameters include designation of a single/double signal shape parameter, designation of a mark type parameter, designation of a mark detection allowance parameter. Further, the mark detection parameters include designation of a parameter of use/nonuse of the two end marks of a multimark, designation of the parameter of the mark detection algorithm or slice level, designation of a parameter of a mark waveform edge detection mode, etc.

Further, by setting the new mark shape parameter derived by the above analysis in the FIA mark data field 411 of the FIA EGA parameter setting screen for example shown in FIG. 7 or the LSA mark data field 421 of the LSA EGA parameter setting screen shown in FIG. 8, it is reflected in the later analysis, simulation, actual processing, etc.

The parameters other than the mark shape are also reflected in the subsequent EGA simulation, control of the exposure apparatus 200, etc.

Figure 12:
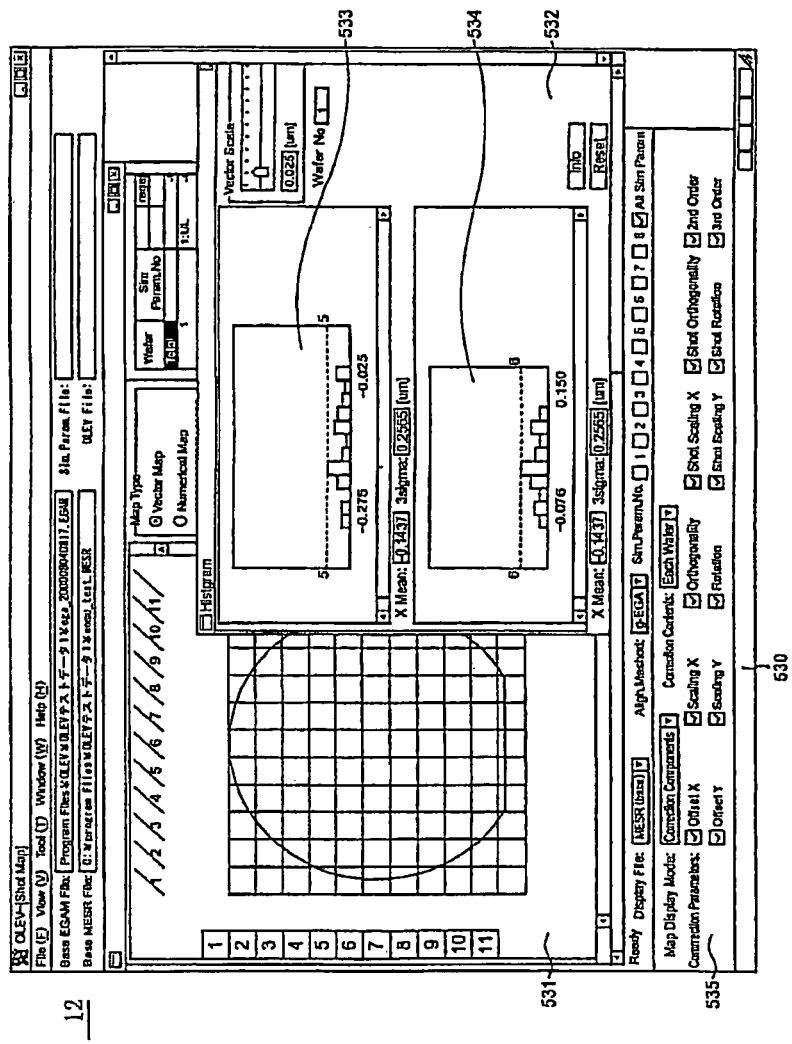
FIG. 12 is a view showing an example of display output of information according to the present invention and shows a screen on which a vector map and histogram comparison chart are displayed.

FIG. 12 is a view of a display screen displaying a vector map of deviation of evaluation data and histograms showing the distribution of frequency of the amounts of deviation.

The screen 530 shown in FIG. 12 displays a window 531 displaying deviation by a vector map based on the positions after for example alignment correction and a window 532 displaying histograms 533 and 534 showing the distribution of frequency of amounts of deviation for the wafer as a whole or other predetermined units.

The histograms 533 and 534 shown in the window 532 show with what frequency what amounts of deviation are distributed for the selected evaluation target.

Therefore, by displaying a plurality of such histograms (two in FIG. 12) by comparison display as shown in FIG. 12, it is possible to compare for example the X-histogram and Y-histogram in the same wafer, compare the X/Y histograms among any lots, wafers, or shots, compare the entirety and individual histograms for any plurality of lots, plurality of wafers, plurality of shots, or plurality of marks. Note that an X-histogram is a histogram relating to the amount of deviation in the X-direction, while a Y-histogram is a histogram relating to the amount of deviation in the Y-direction.

Due to this, it is possible to compare the desired data for evaluation with the reference data as not the simple average value or 3σ, but the specific distribution of frequency or compare two or more objects for evaluation with each other, so it is possible to select the shots for EGA calculation or the marks for measurement in the shots, judge the reject allowance or the number of shots requiring EGA measurement, and judge the parameters of EGA explained above in more detail.

Note that the distribution of the histogram preferably has little variation and particularly has no anomaly data.

Note that the two histograms 533 and 534 of the window 532 may be for example displayed overlaid (overlay display). Any easily viewable display method may be selected for display in accordance with the type or state of the histograms.

Further, in the comparison display screen, to facilitate viewing of the points of difference, it is also possible to change the color, thickness, etc. of the bar graphs between the bar graphs displayed by comparison display or overlay display.

Further, in this display mode, when selecting the alignment correction value or residual component after alignment correction for the evaluation target, it is possible to individually designate use/nonuse of the wafer offset (X/Y), wafer scaling (X/Y), wafer rotation, wafer orthogonality, shot scaling (X/Y), shot rotation, shot orthogonality, and other correction factors and the second order correction coefficient at the time of higher order EGA correction and third order correction coefficient at the higher order EGA correction displayed in the correction parameter field 535 of the window 530.

Due to this, it is possible to set which factor is dominant in the alignment correction, set the use/nonuse of each correction factor and each correction coefficient, set a certain correction value for addition to each correction factor and correction coefficient, or suitably make other judgments.

Note that the correction parameters based on these judgments are set in the wafer correction field 431 and shot correction field 432 of the setting screen of the wafer exposure conditions and parameters shown in FIG. 9.

Further, the input parameters are reflected in the later EGA simulation, control of the exposure apparatus 200, etc.

Figure 13:
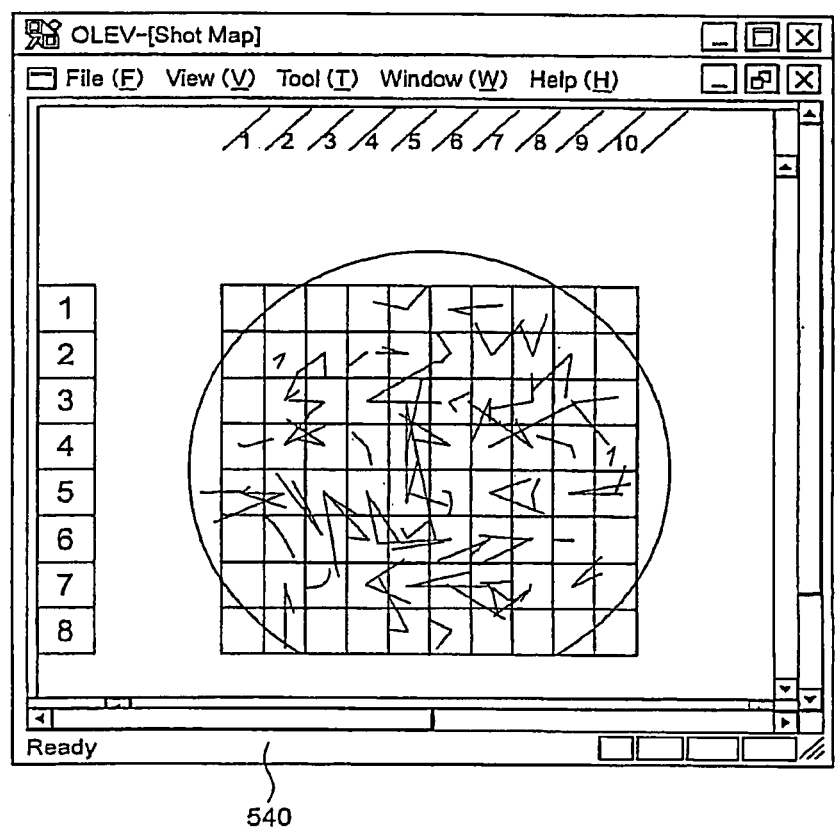
FIG. 13 is a view showing an example of display output of information according to the present invention and shows a screen on which a vector overlay map of residual components after alignment is displayed.

FIG. 13 is a view of the display screen of a vector overlay map of residual components after alignment correction.

The screen (window) 540 shown in FIG. 13 displays vector maps of residual components after alignment correction calculated for the two conditions of a second order EGA calculation model and up to a third-order EGA calculation model by overlay display.

By this display output, the comparison between the residual components when using a second order EGA calculation model and the residual components when using a third order EGA calculation model becomes easy and clear.

As the data of the residual components for comparison, in addition to comparing the numerical values in the log data as they are, it is possible to find the average for a plurality of wafers, 3σ, the absolute value of the average +3σ, the maximum value (MAX), minimum value (MIN), range, or other statistical information by calculation and compare the calculated values for this plurality of wafers.

For example, when comparing the residual components after second order and third order alignment correction by higher order EGA calculation models such as shown in the example of FIG. 13, it is possible to find the average between a plurality of wafers by the higher order calculation models and compare the averaged results.

Further, by using the "absolute value of the average +3σ" between the plurality of wafers by the higher order calculation models, comparison of the results stressing stability becomes possible.

Further, by using the maximum value (MAX) among the plurality of wafers by the higher order calculation models, comparison of the results considering the worst amount of deviation among a plurality of wafers at specific shot positions on a wafer becomes possible.

Note that with residual components after alignment correction, it is preferable that the vectors be short in length and there be little anomaly data. Further, it is preferable that there be no trend of mark deviation being large in one direction and that the amount of deviation be dispersed in the two XY directions.

Further, the evaluation data between different lots or different wafers under the same conditions may be displayed by overlay display. Due to this, it is possible to evaluate variation between different lots and wafers under the same conditions.

Figure 16:
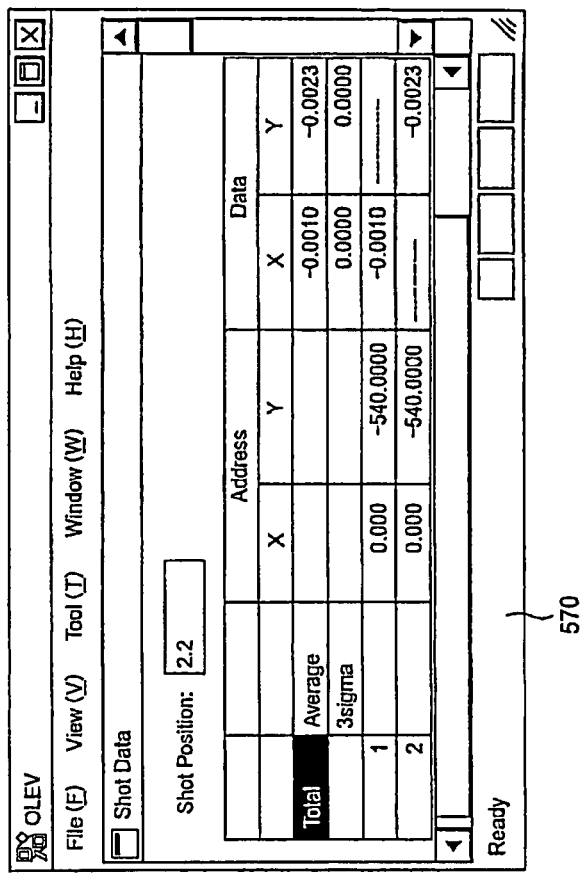
FIG. 16 is a view showing an example of display output of information according to the present invention and shows a screen on which shot data of residual components after alignment correction is displayed by numerical values.

Note that the actual values at the locations displayed by vector display can be displayed and output by the numerical display mode such as shown in the display screen 570 shown in FIG. 16 for each shot by for example switching the display mode.

Further, in this vector map overlay display, to facilitate viewing of the points of difference, it is also possible to change the color, thickness, shape (broken lines, solid lines, etc.) etc. of the vectors between the compared vectors.

Figure 14:
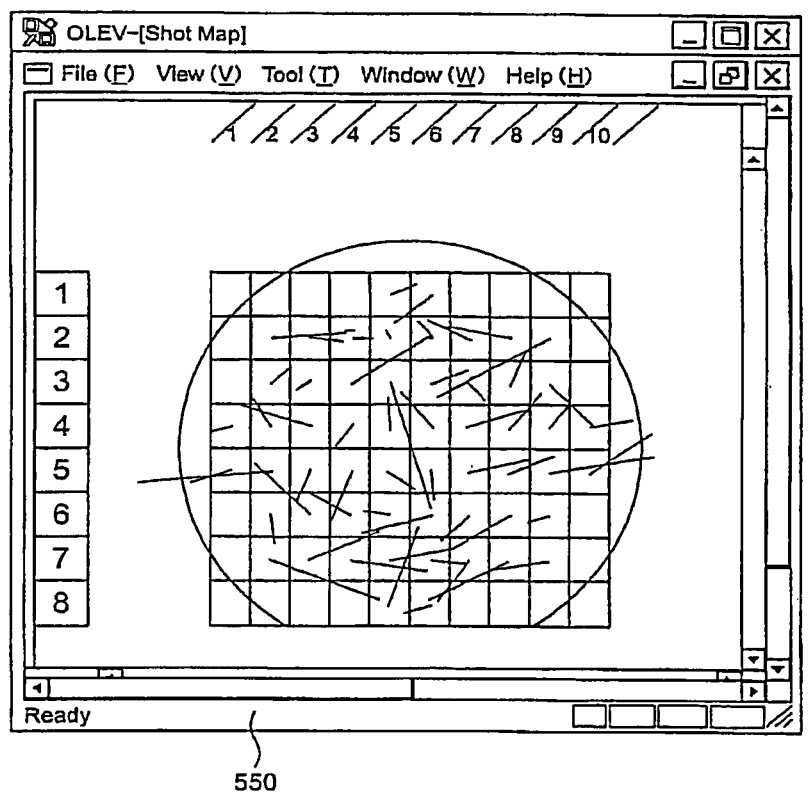
FIG. 14 is a view showing an example of display output of information according to the present invention and shows a screen on which a map of the difference of residual component vectors after alignment is displayed.

FIG. 14 is a view of a display screen of a vector difference map of residual components after alignment correction.

The screen (window) 550 shown in FIG. 14 displays a vector map using the amount of difference of the residual components after alignment correction calculated for the two conditions of the second order EGA calculation model and up to third-order EGA calculation model as the difference data for each mark position. This does not display the two vectors relating to the residual components of the second order model and third order model like in the display of FIG. 13, but displays the difference of the second order model and three-dimensional model by a single vector and therefore simplifies the view.

As the wafer data, like in the case of FIG. 13, it is possible to compare the numerical values in the log data as they are and also find and compare statistical information.

Further, by using the "absolute value of the average +3σ" between a plurality of wafers by higher order calculation models, evaluation of the amounts of difference for results stressing stability becomes possible.

Further, by using the maximum value (MAX) among a plurality of wafers by higher order calculation models, evaluation of the amounts of difference for results considering the worst amount of deviation for each mark becomes possible.

Further, it is also possible to display the evaluation data between different lots or different wafers under the same conditions by such a vector difference map. Due to this, it is possible to evaluate the variation between different lot and wafers under the same conditions.

The conditions are selected for specific conditions as a result of this evaluation. Further, when there are a plurality of conditions where significance is recognized as a result of evaluation using the difference of FIG. 14, further the vector overlay map shown in FIG. 13, the shot data list display shown in FIG. 19, etc. is used for evaluation of the residual components after alignment correction and selection of the good conditions by the variation (distribution) of residual components, the anomaly data of residual component, the average of the sum of squares of the residual components, whichever is smaller, or the other evaluation criteria.

Further, the parameters are changed so as to obtain stable results when there is a large difference between different lots and wafers under the same parameters.

Note that in the example of display shown in FIG. 14, the difference between two conditions is displayed, but it is also possible to find the differences between two or more conditions and display the range of difference from the differences between the differences by a vector map.

FIG. 5 is a view of the screen showing the degree of vector correlation of residual components after alignment correction by a vector map.

Figure 15:
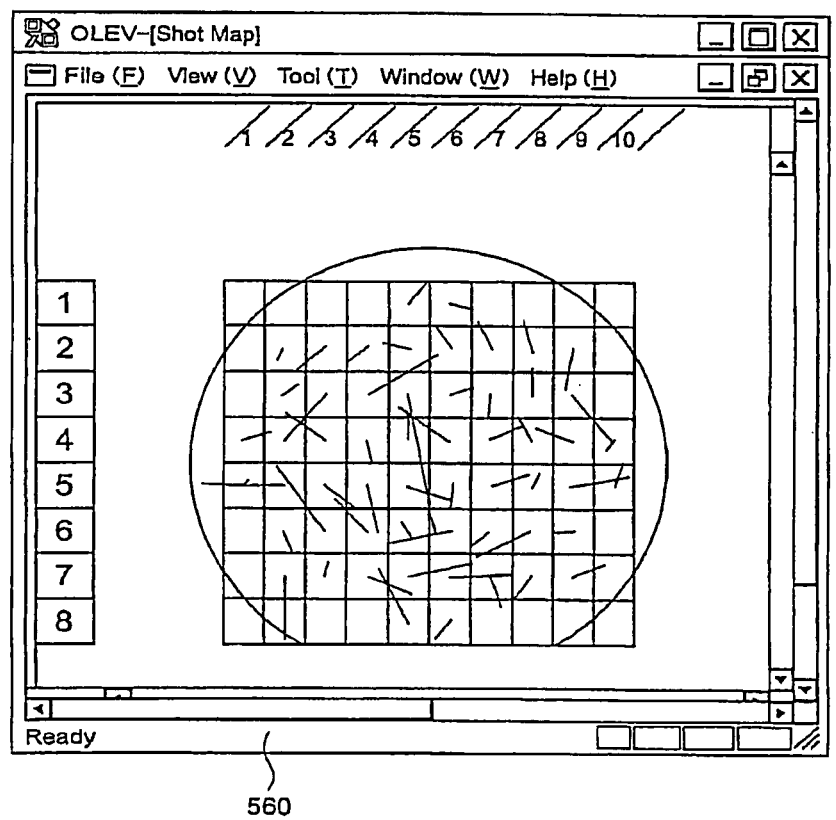
FIG. 15 is a view showing an example of display output of information according to the present invention and shows a screen on which a residual component vector correlation map after alignment correction is displayed.

The screen (window) 560 shown in FIG. 15 displays the vector correlation degrees of residual components after alignment correction calculated for the two conditions of the second order EGA calculation model and third order EGA calculation model by a vector map for each mark.

By this display and output, it is possible to evaluate, in mark units, the vector correlation degree of the evaluation data calculated for each mark when changing the EGA parameters and wafer exposure condition (overlay) parameters for the selected evaluation data file (EGA measurement result file or overlay measurement result file) and selected evaluation target (alignment measurement value, alignment correction value, residual error after alignment correction, etc.) Therefore, it is possible to judge the effect of a change in each alignment parameter on the evaluation data and possible to easily optimize each alignment parameter.

As the wafer data, the average between a plurality of wafers, 3σ, absolute value of the average +3σ, maximum value (MAX), minimum value (MIN), range, etc. is designated for each mark.

For example, as in the example shown in FIG. 15, when evaluating the amount of difference in the residual components after second order and third order alignment correction by higher order EGA calculation models, it is possible to use the average for a plurality of wafers by higher order calculation models and judge the correlation degree for the averaged results.

Further, by using the "3σ" or "absolute value of average +3σ" for a plurality of wafers at the higher order calculation model, evaluation of the correlation degree for results stressing stability becomes possible.

Further, by using the maximum value (MAX) between a plurality of wafers in each higher order calculation model, evaluation of the correlation degree for the results considering the worst amount of deviation for each mark becomes possible.

Further, it is also possible to display evaluation data between different lots or different wafers under the same conditions or same parameters by such a vector correlation degree map. Due to this, it is possible to evaluate the variation between different lots and wafers under the same conditions and same parameters.

When the result of judgment of the correlation degree is that a significant difference is recognized, that is, when the vector correlation degree is lower than a predetermined threshold value, the vector overlay map display shown in FIG. 14, the shot data list display shown in FIG. 19, etc. is used for evaluation of the residual components after alignment correction and the variation of residual components (distribution), the anomaly data of the residual components, and the average of the sum of squares of the residual components, whichever is smaller, or other evaluation criteria is used to select the parameters of the better conditions.

Further, when the correlation degree between different lots and wafers under the same parameters is small, the parameters are changed so that stable results can be obtained.

Here, several examples of display of evaluation data by numerical values will be explained.

FIG. 16 is a view showing a screen displaying numerical values of residual components after alignment correction as data relating to shots.

In the screen 570 shown in FIG. 16, the design coordinates (X,Y) of the mark at a selected shot (in the example of FIG. 16, the shot at the shot position (C (Column):2, R (Row):2)) and the residual component for the same (X,Y) are displayed as numerical values.

This numerical display is performed when, for example, the worker selects the desired shot on the screen and switches the display mode when displaying a vector overlay map of the residual components after alignment correction shown in FIG. 13. Due to this, it is possible for a worker to obtain a grasp of the residual components by numerical values.

Figure 17:
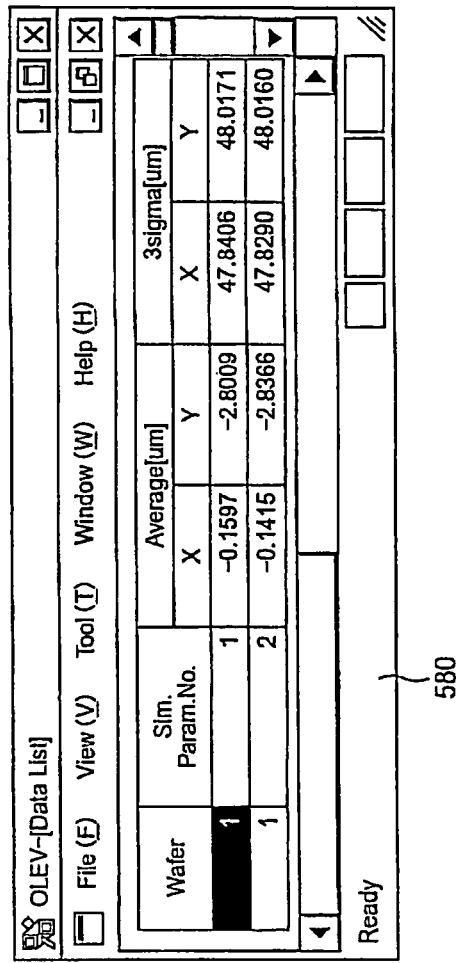
FIG. 17 is a view showing an example of display output of information according to the present invention and shows a screen displaying a wafer average and 3σ of residual components after alignment correction etc. enabling comparison for each setting of calculation parameters by numerical values.

FIG. 17 is a view showing the screen for comparison display of the wafer average, 3σ, etc. of the residual components after alignment correction by numerical values.

The screen 580 shown in FIG. 17 displays by numerical display the average of the residual component, 3σ, etc. for the same wafer in the case of alignment correction under two conditions. As the data of the numerical display, there are the average and 3σ and also the maximum value (MAX minimum value (MIN), range, and type of distribution (skewness and kurtosis) of the variation or other data. Note that in FIG. 17, only the display of the wafer average and 3σ can be seen, but it possible to view other data by using the left and right slide bars.

Figure 18:
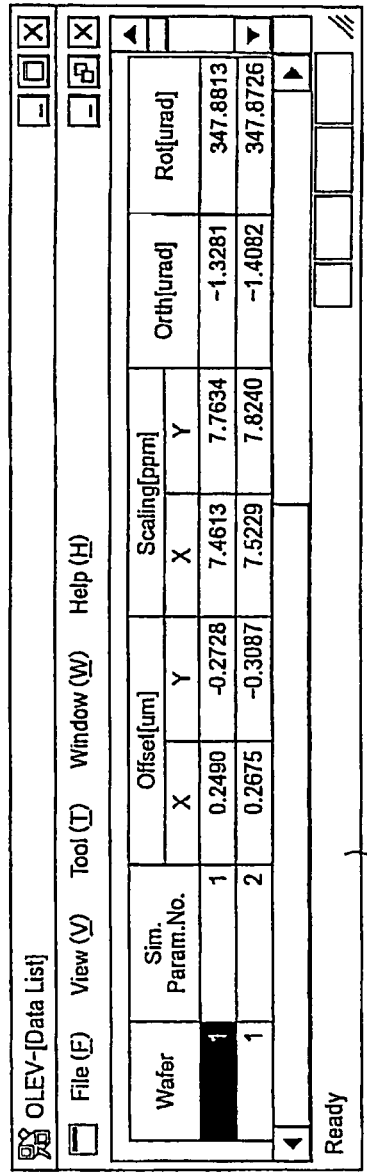
FIG. 18 is a view showing an example of display output of information according to the present invention and shows a display screen comparing the results of calculation of EGA parameters.

FIG. 18 is a view showing a screen for comparison display of the results of calculation of the EGA parameters by numerical values.

The screen 590 of FIG. 18 displays for comparison the results when calculating the EGA parameters under two conditions for the same wafer.

FIG. 19 is a view showing a screen showing a list of data relating to a plurality of shots. The screen 600 shown in FIG. 19 displays the results of mark measurement of shots in a wafer. With this display mode, it is possible to display not only the measurement results, but also the alignment measurement values, alignment correction values, and residual components after alignment correction.

Further, it is possible to display data by numerical values by an operation for selection by a worker from the display of the types of wafer maps such as shown in FIG. 11 to FIG. 15.

Next, several display screens enabling more sophisticated statistical processing to be performed on the evaluation data and a worker to intuitively grasp the situation will be shown.

Figure 20:
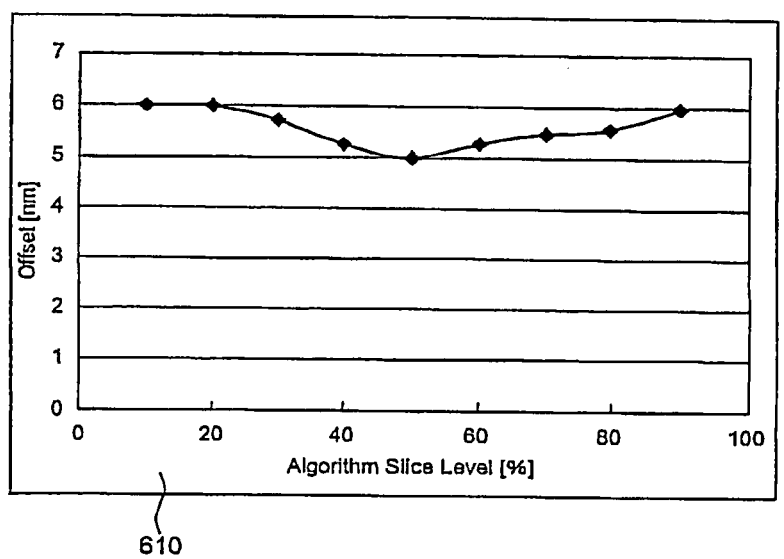
FIG. 20 is a view showing an example of display output of information according to the present invention and shows a scatter diagram showing the correlation between an algorithm slice level and mark detection offset.

The line graph 610 shown in FIG. 20 shows the correlation between the algorithm slice level and mark detection offset. When changing the slice level from 0% to 100% in the mark detection parameters in EGA simulation, when changing the contrast limit from 0% to 100%, when changing the mark detection allowance from 0 μm to 999.999 μm, or when otherwise continuously changing the values for evaluating the simulated results, this type of graph should be displayed.

Figure 21:
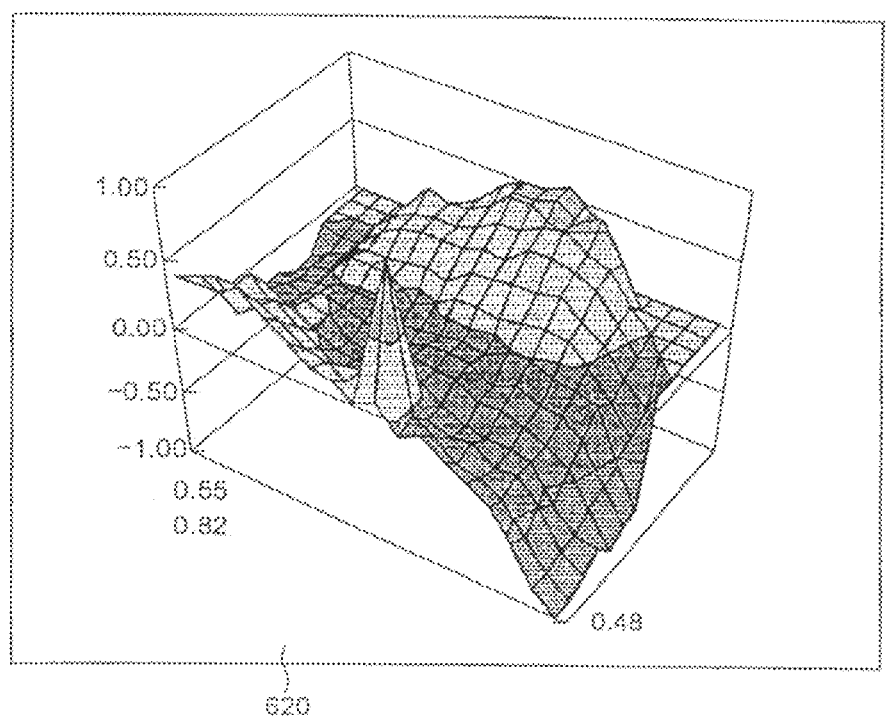
FIG. 21 is a view showing an example of display output of information according to the present invention and shows a display screen of contour lines of a scalar map.

The graph 511 shown in FIG. 21 is a graph showing two evaluation data by contour lines as a scalar map. The scalar map or other contour line display graph 620 shown in FIG. 21 is a view showing for example the square roots of the sum of squares of the X-component and Y-component of the difference of residual components after alignment correction as height data of the position on a graph corresponding to the X-position and Y-position of the shot on the wafer. Alternatively, for example, the correlation of the residual components after alignment correction can be used when displaying not just the vector correlation map such as shown in FIG. 15, but also a scalar map using the value of equation (13) to combine the X-component and Y-component. This is effective for an overall evaluation by the composite values of the X-component and Y-component without considering the direction of the vector.

Figure 22:
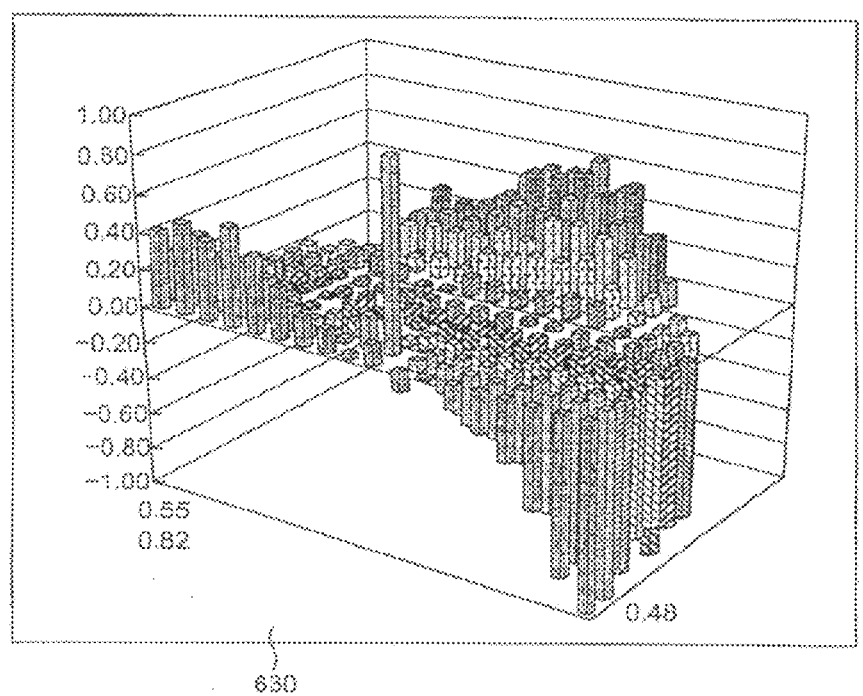
FIG. 22 is a view showing an example of display output of information according to the present invention and shows a display screen of bar graphs of a scalar map.

Further, the bar graph 630 shown in FIG. 22 is an example of display of the scalar map of the two evaluation data shown in FIG. 21 by three-dimensional bar graphs. In the alignment data evaluation system of the present embodiment, in this way it is possible to output the same data for display by any mode.

In the alignment data evaluation system of the present embodiment, it is possible to display and output any data by the desired mode and efficiently and suitably analyze and evaluate data.

Next, the method of displaying various data useful for determination of the alignment conditions using this alignment data evaluation system, in particular processing for optimizing the higher order EGA calculation model for the operations on the screen, will be explained.

As one example of optimization of conditions, the case of studying whether it would be best to make the calculation model a second order, six parameter model or a third order, six parameter model will be explained. To achieve this object, the residual components after alignment correction are selected as the evaluation target, the information of the following (a) and (b) of the residual components after alignment correction are displayed by the desired mode, and the contents are confirmed.

(a) Residual components after alignment correction for each shot (mark) position.

(b) average and 3σ for each specific mark, for each specific shot, for each specific wafer, and for each specific lot of the residual components after alignment correction and the maximum value (MAX), minimum value (MIN), range, and type of distribution (skewness and kurtosis) of variation.

The residual components after alignment correction for each mark measurement position of (a) are used for analysis of the trends in the average and the breakdown of variation.

Further, here, for example, as the evaluation data, the EGA log data is used. The display unit is designated for each single wafer. When designating each single wafer as the display unit, no particular operation should be performed on the screen. When the data selected as the evaluation target relates to a plurality of wafers, the data is recognized as being divided for each wafer. By designating the wafer number, information of the wafer corresponding to the number is displayed for each single wafer. The wafer number is designated by input to the "Wafer No." field in the middle of the right side of the screen 510 of FIG. 10 or by operation of the scroll bar of the "Wafer No." field.

That is, by operating the scroll bar of the "Wafer No." field or inputting the wafer number in the number entry box below it, the information of the corresponding wafer is displayed in single wafer units. If checking the "All Wafer" check box, the data of all wafers for evaluation is simultaneously displayed overlaid on a single map. Here, data between wafers is discriminated by the color, thickness, shape, etc. of the vector display.

Note that as explained above, in the (b), the smaller the average and 3σ of the residual components after alignment correction and the maximum value (MAX), minimum value (MIN), and range of the variation the better. Further, the skewness should be close to 0 (good left-right symmetry) and the kurtosis should be large (distribution concentrating).

Further, when designating specific shots on the wafer mark map of the screen 510 of FIG. 10, displaying information for each specific shot, and setting a reject designation for a shot when a mark degrades on a specific shot such as at the periphery of the wafer, it is possible to delete this from calculation by the shot units. Unsuitable data can be removed in the same way for a specific mark, specific wafer, or specific lot.

Note that when selecting the evaluation target, the address and file name saved in the EGA log data file are entered in the base EGAM file field above the screen 530 of FIG. 12 and below the menu bar or the address and file name saved in the file of the overlay measurement log data are entered in the base MASR file field.

Note that average or 3σ or other statistical information is found based on the information of a plurality of wafers . . . . For example, the average of the residual error component for the (Column, Row)=(2,2) of the first wafer and the residual error component for the (Column, Row)=(2,2) of the second wafer is found and this is displayed on a single wafer based on the designation of "display unit=each single wafer". When display average or 3σ or other information based on the information for a plurality of wafers under such a designation of "display unit=each single wafer", as an example of the operation on the screen for designating a plurality of wafers, checking "All wafers" in the check box of the "Wafer No." field at the right center of the screen 510 of FIG. 10 may be mentioned.

Further, as an example of display relating to the (b), a comparison by numerical display of the results of calculation of the second order EGA calculation model and third order EGA calculation model such as shown in FIG. 17 is preferable. A numerical display may be obtained by double clicking on a desired shot on the screen 510 of FIG. 10 or single clicking on the desired shot for selection, then pressing the "shot data" button at the bottom right of the screen.

In the example of FIG. 17, the wafer average and 3σ of the residual components after alignment correction and the maximum value (MAX), minimum value (MIN), range, and distribution shape (skewness and kurtosis) of the variation are numerically displayed. Note that as explained above, in the screen of FIG. 17, the maximum value (MAX), minimum value (MIN), range, and distribution shape (skewness and kurtosis) of the variation can be viewed by using the left and right slide bars.

Further, as an example of display relating to the above (a), it is effective to use FIGS. 13, 14, 15 for a comparison by the above-mentioned vector map display method. By designating "Vector Map" in "Map Type" on the screen 510 of FIG. 10, a vector map is displayed.

I. Vector Map Display by Overlay Method

This displays overlaid the results of calculation of the second order EGA calculation model and the results of calculation of the third order EGA calculation for each model mark measurement position for the residual component after alignment correction. Due to this, it is possible to evaluate by comparison the results of calculation of residual components by two calculation models for each mark position. As a specific example, the vector overlay map screen 540 of residual components after alignment correction as shown in FIG. 13 are used for comparison.

Further, when desiring to evaluate the effects of higher order calculation models compared with the results-of-linear first order calculation, it is possible to display overlaid the residual components of either of the results of calculation of the second order EGA calculation model or third order EGA calculation model with the results of calculation of an ordinary first-order EGA calculation model.

II. Vector Map Display by Difference Method

This displays the results of calculation on the difference of residual components when using a second order EGA calculation model and residual components when using a third order EGA calculation model for each mark measurement position. As a specific example, the vector difference map screen 550 of residual components after alignment correction as shown in FIG. 14 is used for comparison.

When desiring to evaluate the effect of the second order EGA calculation model and third order EGA calculation model on the first order EGA calculation model, the difference between the second order EGA calculation model and the first order EGA calculation model and the difference between the third order EGA calculation model and first order EGA calculation model may be displayed overlaid. That is, the correction amounts of nonlinear components in the third order EGA calculation model and second order EGA calculation model can be compared.

Further, it is also possible to obtain and combine the square roots of the sum of squares of the X-component and Y-component of the differences and display them as contours of a scalar map as shown in FIG. 21 as a scalar difference map or bar graphs of a scalar map as shown in FIG. 22.

III. Vector Map Display by Correlation Method

This displays the correlation value of residual components when using a second order EGA calculation model and the residual components when using a third order EGA calculation model for each mark measurement position. A low correlation value means a large difference in residual components between when using a second order EGA calculation model and when using a third order EGA calculation model. By using a vector map as described above using FIG. 15, it is possible to obtain a visual grasp of the difference or similarity between the case of using a second order model and a case of using a, three-dimensional model.

Further, in the same way as the difference method, it is also possible to display the contours of the scalar map such as shown in FIG. 21 or bar graphs of the scalar map such as shown in FIG. 22.

Further, when desiring to evaluate not each mark, but the correlation value in wafer units, the value of equation (4) is used.

Note that if selecting numerical map from the map display mode (map type) at the top right of the screen 510 shown in FIG. 10, designating any shot, and pushing the "shot data" button at the bottom right of the screen, the numerical data according to the designated shot is displayed as shown in FIG. 16.

Further, when evaluating the numerical data all is together, if designating a plurality of shots by the mark map of FIG. 10, then selecting a numerical map from the map types, a data list such as explained using FIG. 19 is displayed.

Further, if switching the map display mode to the alignment mark map and designating any shot, as shown in FIG. 11, data according to the designated shot is displayed. In FIG. 11, a waveform diagram 523 for a designated shot (mark) and a waveform diagram 524 referred to as a reference are displayed by comparison display.

The above displays are used for evaluation and based on that the higher order EGA conditions and alignment conditions are determined.

The determined conditions are reflected in the reevaluation, EGA simulation, overlay simulation, and, the actual exposure processing by pressing the "apply" button at the bottom right.

Note that as the above-mentioned specific example, the example of optimization of the higher order EGA calculation model was described, but the same is true as when selecting residual components after alignment correction as the evaluation target even when using EGA simulation to optimize FIA or LSA processing algorithms.

When desiring to compare the results of simulation when continuously changing the values of mark detection parameters in EGA simulation, that is, the algorithm slice level from 0% to 100%, the contrast limit from 0% to 100%, and the mark detection allowance from 0 μm to 999.999 μm, the display of a graph such as shown in FIG. 20 is effective.

In the case of the graph of the above-mentioned FIG. 20, this is a graph for the case of designating the alignment measurement value (offset) as the evaluation target, designating the data display unit as each single mark, and changing the algorithm slice level of the EGA simulation parameters. The same is true even when the evaluation target is the contrast limit. In the case of the mark detection allowance, it is sufficient to designate the residual components of the alignment correction as the evaluation target and designate each plurality of wafers as the data display unit.

Further, above, the explanation was given of a configuration where a user directly selected the display mode from a numerical display, vector display, histogram, statistical display, sort result display, waveform data display, or other various displays, but the present invention is not limited to this. By linking objects predicted by a user and predetermined display modes and having the user select the object, it is also possible to have the optimal display mode for the object be automatically selected.

For example, when the object is "cause of waveform detection error", rather than having the user select "waveform data display", it may also be considered to have him select "cause of waveform detection error" as the object and have the "waveform data display" automatically selected as the display mode. Alternatively, it may be considered to have the user "change of mark detection offset due to change of parameter" as the object and have the "graph display" automatically selected.

By linking the object and display mode in this way, even if the user has no knowledge relating to the different display modes, a suitable display mode is selected and the suitably selected display mode enables a user to obtain an intuitive grasp of the situation.

Device Production Process

Next, a process of production of a device using the above exposure system for lithography will be explained.

Figure 23:
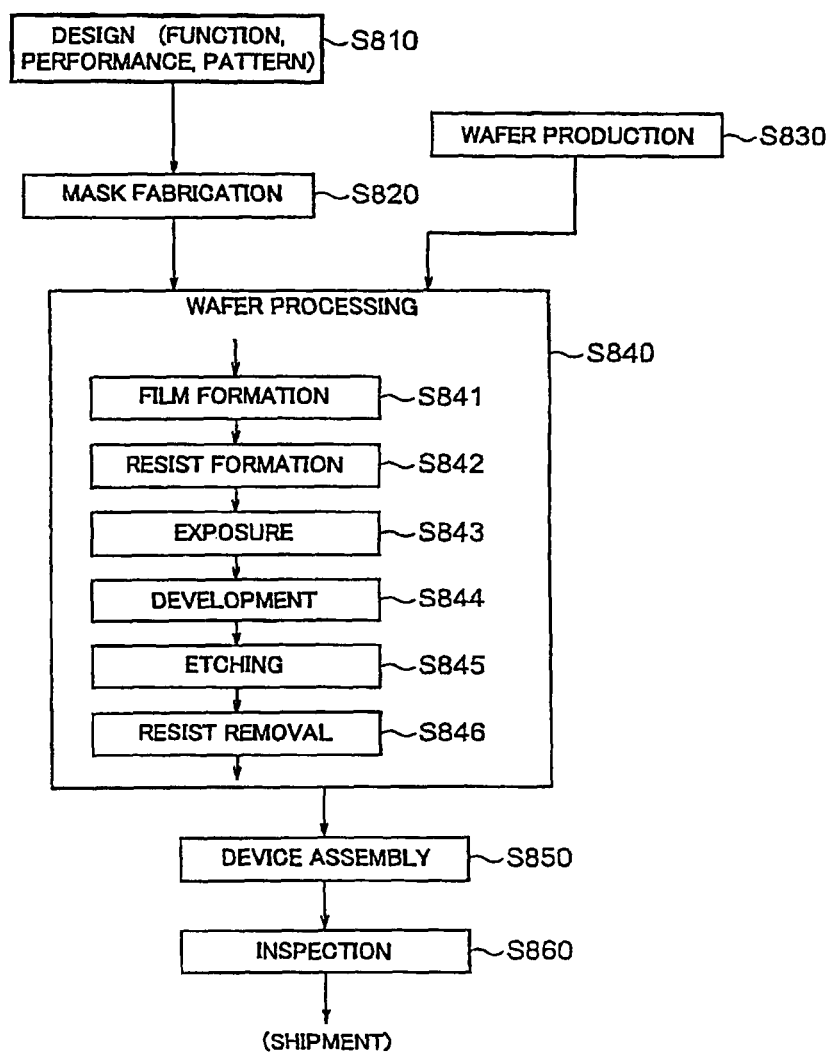
FIG. 23 is a flowchart for explaining a production process of a device according to the present invention.

FIG. 23 is a flowchart showing the process of production of for example an IC or LSI or other semiconductor chip, a liquid crystal panel, CCD, thin film magnetic head, micromachine, or other electronic device.

As shown in FIG. 23, in the process of production of an electronic device, first, the circuits of the electronic device are designed, the functions and performance of the device are designed, and the patterns for realizing these functions are designed (step S810), then the mask for forming the designed circuit patterns is fabricated (step S820).

On the other hand, silicon or another material is used to produce a wafer (silicon substrate) (step S830).

Next, the mask fabricated at step S820 and the wafer produced at step S830 are used for lithography etc. to form the actual circuits on the wafer (step S840).

Specifically, first, the wafer surface is formed with an insulating film, electrode interconnect film, or semiconductor film (step S841), then the entire surface of this thin film is coated with a photosensitizer (resist) using a resist coater (step S842).

Next, the substrate coated with this resist is loaded on the wafer holder of the exposure apparatus according to the present invention, the mask produced at step S830 is loaded on the reticle stage, and the pattern formed on the mask is transferred reduced to the wafer (step S843). At this time, the exposure apparatus successively positions shot areas of the wafer by the positioning method according to the present invention and transfers the mask patterns to the shot areas.

After finishing being exposed, the wafer is unloaded from the wafer holder and developed using a developer (step S844). Due to this, the surface of the wafer is formed with a resist image of the mask patterns.

Further, the developed wafer is etched using an etching device (step S845) and the resist remaining on the wafer surface is removed using a for example plasma ashing device (step S846).

Due to this, each shot area of the wafer is formed with an insulating layer or electrode interconnects or other patterns. Further, this processing is successively repeated while changing the mask so as to form the actual circuits on the wafer.

After the circuits etc. are formed on the wafer, the devices are assembled (step S850). Specifically, the wafer is diced into individual chips, the chips are mounted on lead frames or packages, electrodes are connected by bonding, and a resin is used for sealing for packaging.

Further, the produced devices are subjected to operation confirmation tests, durability tests, and other tests (step S860), then are shipped out as finished devices.

Modifications

Note that the present embodiment was described for facilitating understanding of the present invention, but this does not limit the present invention in any way. The elements disclosed in the present embodiment include all design modifications and equivalents falling within the technical scope of the present invention and may be modified in any way.

The overall configuration of for example the exposure system is not limited to the configuration shown in FIG. 1.

For example, for example, the information server 160 centrally storing the data of the EGA measurement results or overlay measurement results or other various types of information may be separately configured. Further, while not shown, it is also possible to connect separate computers to the Intranet and distribute the processing. Further, the system may also be constructed as a system constructed through another communication network or further a so-called server-client type system. The calculations at the devices of the exposure system, the processing for control, the mode of distribution, in other words the mode of distribution of the functions of the distributed processing system, and the mode of connection of the devices as a network system may be any mode.

Further, the present embodiment was explained with reference to the case of using an off-axis type FIA system (imaging type alignment sensor) as an alignment system, but the invention is not limited to this and may use any type of mark detection system. That is, it may be any of a TTR (Through The Reticle) system, TTL (Through The Lens) system, or further off-axis system. Further, in addition to the imaging system which the detection system employs with a FIA system etc (image processing system), a system detecting for example diffraction light or scattered light may also be used. For example, it is also possible to use an alignment system which fires a coherent beam on an alignment mark on the wafer substantially vertically and detects diffraction light of the same order generated from the mark (±first order, second order, . . . ±n-th order diffraction light) by causing interference. In this case, it is also possible to independently detect the diffraction light for each order and use the results of detection of at least one order, emit a plurality of coherent beams different in wavelength to the alignment marks, and detect the diffraction light of the next order for each wavelength by causing interference.

Further, the present invention is not limited to a step-and-scan type exposure apparatus like in the above embodiment and may also be applied in exactly the same way as various types of exposure apparatuses such as the step-and-repeat type or proximity type exposure apparatus (X-ray exposure apparatus etc.)

Further, the exposure illumination light used in the exposure apparatus (energy beam) is not limited to ultraviolet light and may also be X-rays (including EUV light) or electron beams or ion beams or other charged particle beams etc. Further, the exposure apparatus may also be one used for production of DNA chips, masks, reticles, etc.

Further, the present invention may also be applied to, in addition to an exposure apparatus, all apparatuses relating to devices having alignment, for example, various types of measurement-inspection apparatuses for wafers or reticles, and further laser leveler apparatuses and apparatuses designed solely for monitoring.

This disclosure relates to the matter included in Japanese Patent Application No. 2004-240058 filed on Aug. 19, 2004 and clearly incorporates by reference all of that disclosure here.

The invention claimed is:

1. An alignment information display method for displaying information relating to alignment measurement for positioning an object, comprising the steps of:
   inputting data of results of predetermined processing relating to the alignment measurement, the data of results of predetermined processing relating to the alignment measurement including data of EGA measurement results measured by an exposure apparatus and data of overlay measurements results measured by an overlay measuring device,
   inputting information relating to a parameter of the alignment measurement,
   finding desired information for display from data of the input data of results of predetermined processing relating to the alignment measurement based on the parameter of the alignment measurement,
   receiving input of an evaluation target of a plurality of evaluation targets, the plurality of evaluation targets including at least one of an alignment measurement value, an alignment correction value, a residual component after alignment correction, and an alignment mark waveform,
   receiving input of a display unit of a plurality of display units, the plurality of display units including information to be displayed about at least one of each predetermined plurality of lots, each single lot, each predetermined plurality of wafers, each single wafer, each plurality of shots processed, each single shot, each predetermined plurality of marks, and each single mark,
   designating a desired display mode of a plurality of display modes, the plurality of display modes including at least one of a numerical data display, vector data display, histogram-scatter diagram, trend graph or other statistical display, sort result display, and waveform data display, and
   displaying the found desired information for display in the desired display mode showing effects of the parameter of the alignment measurement on the alignment measurement, wherein
   the found desired information for display is displayed in each of the received display unit of the plurality of display units by the desired display mode of the plurality of display modes during the step of displaying so as to enable evaluation of the received evaluation target, and
   the displaying comprises displaying the shown effects in each received display unit of the plurality of display units using the same parameter, the shown effect being achieved by displaying a plurality of displays, each display representing a respective different display unit.

2. The alignment information display method as set forth in claim 1, further comprising the steps of
   inputting information relating to simulation of the alignment measurement and
   running a predetermined simulation in accordance with need based on the input information relating to simulation, wherein
   at least one of the simulation results and the found desired information for display is displayed in each of the received display unit of the plurality of display units by the desired display mode during the step of displaying to thereby enable evaluation of the received evaluation target.

3. The alignment information display method as set forth in claim 2, further comprising the step of finding a plurality of the simulation results or the found desired information for display, wherein
   the plurality of simulation results or the found desired information for display is displayed in each of the received display unit of the plurality of display units by the desired display mode during the step of displaying to thereby enable evaluation of the received evaluation target.

4. The alignment information display method as set forth in claim 1, further comprising the step of inputting information relating to display of log information of the alignment measurement, wherein
   the log information of the alignment measurement is displayed in accordance with need based on information relating to display of the input log information.

5. The alignment information display method as set forth in claim 1, wherein the information relating to a parameter of the alignment measurement include at least one of an EGA calculation model, reject allowance, shots for EGA calculation, and wafer for measurement.

6. An alignment method for determining a parameter of the alignment measurement based on information relating to alignment measurement displayed by the alignment information display method as set forth in claim 1 and
   using the determined parameter for alignment measurement to position an object.

7. An exposure method for transferring predetermined patterns on a plurality of areas formed on a substrate, comprising
   using an alignment method as set forth in claim 6 to position the plurality of areas on the substrate and the predetermined patterns and transferring the predetermined patterns on the positioned areas.

8. A device production process comprising including a process using an exposure method as set forth in claim 7 to transfer device patterns onto a device substrate.

9. A non-transitory computer readable medium storing a program for making a computer execute to display information relating to alignment measurement for positioning an object, the program comprising instructions to perform:
- a step of inputting data of predetermined processing results relating to the alignment measurement, the data of results of predetermined processing relating to the alignment measurement including data of EGA measurement results measured by an exposure apparatus and data of overlay measurement results measured by an overlay measuring device,
- a step of inputting information relating to a parameter of the alignment measurement,
- a step of finding desired information for display from data of the input data of predetermined processing results relating to the alignment measurement based on the input parameter of the alignment measurement,
- a step of receiving input of an evaluation target of a plurality of evaluation targets, the plurality of evaluation targets including at least one of an alignment measurement value, an alignment correction value, a residual component after alignment correction, and an alignment mark waveform,
- a step of receiving input of a display unit of a plurality of display units, the plurality of display units including information to be displayed about at least one of each predetermined plurality of lots, each single lot, each predetermined plurality of wafers, each single wafer, each plurality of shots processed, each single shot, each predetermined plurality of marks, and each single mark,
- a step of designating a desired display mode of a plurality of display modes, the plurality of display modes including at least one of a numerical data display, vector data display, histogram-scatter diagram, trend graph or other statistical display, sort result display, and waveform data display, and
- a step of displaying the found desired information for display in a desired display mode showing the effects of the parameter of the alignment measurement on the alignment measurement, wherein
- the found desired information for display is displayed in each of the received display unit of the plurality of display units by the desired display mode of the plurality of display modes during the step of displaying so as to enable evaluation of the received evaluation target, and
- the displaying step comprises displaying the shown effects in each received display unit of the plurality of display units using the same parameter, the shown effect being achieved by displaying a plurality of displays, each display representing a respective different display unit.

10. A display system for displaying results of functional evaluation relating to a predetermined function of a predetermined device, the predetermined device being an exposure apparatus for transferring predetermined patterns to a semiconductor substrate, the results of functional evaluation relating to an alignment function for adjusting a relative positional relationship between the predetermined patterns and the semiconductor substrate, the displaying system comprising:
- a storage device connected to the exposure apparatus in a manner enabling transmission of information and storing data of EGA measurement results measured by the exposure apparatus and data of overlay measurement results measured by an overlay measuring device as information relating to results of processing performed by the exposure apparatus in the past,
- a first input device for inputting a usage condition for using the predetermined function,
- a simulation device connected to the storage device and the first input device in a manner enabling transmission of information and simulating processing results when performing the predetermined function under the usage condition input from the first input device based on processing results at the predetermined device stored in the storage device,
- a display device for displaying results of simulation by the simulation device, and
- a second input device for selecting and instructing an evaluation target, a display unit, and a display mode for displaying the simulation results by the display device from among a plurality of previously prepared evaluation targets, a plurality of previously prepared display units, and a plurality of previously prepared display modes, the plurality of previously prepared evaluation targets including at least one of an alignment measurement value, an alignment correction value, a residual component after alignment correction, and an alignment mark waveform, the plurality of previously prepared display units including information to be displayed about at least one of each predetermined plurality of lots, each single lot, each predetermined plurality of wafers, each single wafer, each plurality of shots processed, each single shot, each predetermined plurality of marks, and each single mark, and the plurality of previously prepared display modes including at least one of a numerical data display, vector data display, histogram-scatter diagram, trend graph or other statistical display, sort result display, and waveform data display,
- wherein the display device is configured to display the simulation results of the same inputted usage condition in each display unit of the plurality of previously prepared display units, and
- wherein the displaying comprises displaying the shown effects in each display unit of the plurality of the previously prepared display units using the same parameter, the shown effect being achieved by displaying a plurality of displays, each display representing a respective different display unit.

11. The display system as set forth in claim 10, wherein the storage device stores at least one of first results obtained by measurement by the alignment function of the exposure apparatus and second measurement results obtained by measurement of the results of transfer of the predetermined patterns to the semiconductor substrate after adjusting the relative position of predetermined patterns and the semiconductor substrate by the alignment function of the exposure apparatus.

12. The display system as set forth in claim 11, wherein the usage condition input from the first input device is a parameter relating to the alignment function.

13. The display system as set forth in claim 10, wherein the evaluation target is any of a measurement value measuring a mask formed on the semiconductor substrate for adjusting a relative position between the predetermined patterns and the semiconductor substrate by the alignment function, a correction value based on an amount of deviation from a reference position of the mark, an amount of deviation from the reference position remaining after correcting the position of the semiconductor substrate, and a measurement result of the mark.

14. The display system as set forth in claim 10, wherein the display unit is any of each plurality of substrates, each substrate, and each mark formed on the substrate processed under the same one usage condition among the plurality of usage conditions input from the first input device.

15. The display system as set forth in claim 14, further comprising displaying a plurality of results by a display unit input from the second input device.

16. A display device for displaying information relating to processing results of alignment, the information relating to the processing results of the alignment including data of EGA measurement results measured by an exposure apparatus and data of overlay measurement results measured by an overlay measuring device, the display device comprising:
   a setting screen for selecting and setting an evaluation target, a display unit, and a display mode from a plurality of evaluation targets, a plurality of display units, and a plurality of display modes, the plurality of evaluation targets including at least one of an alignment measurement value, an alignment correction value, a residual component after alignment correction, and an alignment mark waveform, the plurality of display units including information to be displayed about at least one of each plurality of lots, each single lot, each plurality of wafers, each single wafer, each plurality of shots, each plurality of marks, and each single mark, and the plurality of display modes including at least one of a graph display, numerical list display, and map display,
   a processing device connected to the setting screen and performing processing relating to alignment, and
   a result display screen connected to the processing device and displaying information relating to results of performance of the processing by the evaluation target, the display unit, and the display mode set by the selection screen,
   wherein the setting screen is configured to display the processing results of a same processing condition in each display unit of the plurality of display units, the processing result being achieved by displaying a plurality of displays, each display representing a respective different display unit.

17. The display device as set forth in claim 16, wherein the plurality of display modes able to be selected and set by the setting screen includes a map display, and the map display includes at least one of an overlay error map, difference map, and correlation map.

18. The display device as set forth in claim 16, wherein the processing device processes a residual component remaining as a result of alignment processing as processing relating to the alignment.

19. The display device as set forth in claim 18, wherein the processing device processes at least one of an average value, standard error, error, maximum value, minimum value, range of value, or other statistical processing results of the residual component.

20. The display device as set forth in claim 16, further comprising an input device connected to the processing device and inputting the processing conditions of the processing device.

21. The display device as set forth in claim 20, wherein the input device enables selection of a model equation and setting of a waveform analysis algorithm or shot array as processing conditions.

22. The display device as set forth-in claim 16, wherein the processing device executes processing relating to the alignment based on past alignment measurement results or measurement results.

23. A non-transitory computer readable medium storing a program for making a computer system to execute:
   a step of displaying a setting screen for selecting and setting an evaluation target, a display unit, and a display mode from a plurality of evaluation targets, a plurality of display units, and a plurality of display modes, the plurality of evaluation targets including at least one of an alignment measurement value, an alignment correction value, a residual component after alignment correction, and an alignment mark waveform, the plurality of display units including information to be displayed about at least one of each plurality of lots, each single lot, each plurality of wafers, each single wafer, each plurality of shots, each plurality of marks, and each single mark, and the plurality of display modes including at least one of a graph display, numerical list display, and map display,
   a step of performing processing relating to alignment, and
   a step of displaying information relating to the alignment processing results by the evaluation target, the display unit, and the display mode set by the setting screen, the information relating to the alignment processing results including data of EGA measurement results measured by an exposure apparatus and data of overlay measurement results measured by an overlay measuring device,
   wherein the step of displaying information comprises displaying the processing results of a same processing condition in each display unit of the plurality of display units, the processing result being achieved by displaying a plurality of displays, each display representing a respective different display unit.

24. The non-transitory computer readable medium storing the program as set forth in claim 23, wherein the program enables selection of a map display as one of the plurality of display modes able to be selected and set on the displayed setting screen and having the map display include at least one of an overlay error map, difference map, and correlation map.

25. The non-transitory computer readable medium storing the program as set forth in claim 23, wherein the processing relating to alignment processes a residual component remaining as a result of the alignment processing.

26. The non-transitory computer readable medium storing the program as set forth in claim 23, the program further including a step of displaying an input screen for inputting the processing condition at the processing device.

27. A measurement/inspection system for detecting information relating to an overlay state of different layers formed overlaid on the substrate,
   the system outputting the detected information as data used for processing in a computer system by a program making the computer system to execute:
   a step of displaying a setting screen for selecting and setting an evaluation target, a display unit, and a display mode among a plurality of evaluation targets, a plurality of display units, and a plurality of display modes, the plurality of evaluation targets including at least one of an alignment measurement value, an alignment correction value, a residual component after alignment correction, and an alignment mark waveform, the plurality of display units including information to be displayed about at least one of each plurality of lots, each single lot, each plurality of wafers, each single wafer, each plurality of shots, each plurality of marks, and each single mark, and the plurality of display modes including at least one of a graph display, numerical list display, and map display,
   a step of performing processing relating to alignment, and
   a step of displaying information relating to the alignment processing results by the evaluation target, the display unit, and the display mode set by the setting screen, the information relating to the alignment processing results including data of EGA measurement results measured by an exposure apparatus and data of overlay measurement results measured by an overlay measuring device, wherein the step of displaying information comprises displaying the processing results of a same processing condition in each display unit of the plurality of display units, the processing result being achieved by displaying a plurality of displays, each display representing a respective different display unit.

28. The measurement/inspection system as set forth in claim 27, wherein a map display can be selected as one of the plurality of display modes able to be selected and set by the setting screen displayed by the program and the map display includes at least one of an overlay error map, difference map, and correlation map.

29. The measurement/inspection system as set forth in claim 27, wherein the processing relating to alignment at the program processes a residual component resulting from the alignment processing.

30. The measurement/inspection system as set forth in claim 27, wherein the program displays an input screen for inputting the processing condition at the processing device.

* * * * *